United States Patent [19]
Ueda et al.

[11] Patent Number: 6,115,592
[45] Date of Patent: *Sep. 5, 2000

[54] FILTER DEVICE AND DUAL-BAND RADIO SYSTEM IN WHICH THE FILTER DEVICE IS USED

[75] Inventors: Masanori Ueda; Osamu Ikata; Hideki Ohmori; Yoshiro Fujiwara, all of Kawasaki; Kazushi Hashimoto, Sapporo, all of Japan

[73] Assignee: Fujitsu Limited, Kanagawa, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/700,099

[22] Filed: Aug. 20, 1996

[30] Foreign Application Priority Data

Aug. 24, 1995 [JP] Japan .................................. 7-216126
Apr. 11, 1996 [JP] Japan .................................. 8-089632

[51] Int. Cl.[7] ............................................. H04B 1/10
[52] U.S. Cl. ..................................... 455/307; 455/303
[58] Field of Search .................................. 333/126, 129, 333/132, 133, 134, 167, 175, 185, 193, 195, 246, 247; 361/782, 811, 820, 821; 257/728, 687, 678; 174/524, 505, 50.51, 50.52; 310/313 R; 455/84, 296, 302, 303, 307, 137, 289, 73

[56] References Cited

U.S. PATENT DOCUMENTS

| | | | |
|---|---|---|---|
| 3,942,137 | 3/1976 | Franco et al. | 333/16 |
| 4,384,263 | 5/1983 | Neuman et al. | 333/185 |
| 4,390,854 | 6/1983 | Calvin . | |
| 4,449,108 | 5/1984 | Endo et al. | 333/134 |
| 5,386,203 | 1/1995 | Ishihara et al. | 333/129 |
| 5,451,818 | 9/1995 | Chan et al. | 257/728 |
| 5,506,552 | 4/1996 | Seki et al. | 333/195 |
| 5,559,481 | 9/1996 | Satoh et al. | 310/313 R |
| 5,561,406 | 10/1996 | Ikata et al. | 333/126 |
| 5,589,806 | 12/1996 | Taguchi et al. | 333/193 |
| 5,603,097 | 2/1997 | Kanou | 455/76 |
| 5,613,234 | 3/1997 | Vella-Coleiro | 455/340 |
| 5,632,909 | 5/1997 | Allen et al. | 216/41 |

FOREIGN PATENT DOCUMENTS

| | | |
|---|---|---|
| 0 460 333 | 12/1991 | European Pat. Off. . |
| 0 663 721 | 1/1995 | European Pat. Off. . |
| 41 32 907 | 4/1993 | Germany . |
| 44 29 132 | 2/1995 | Germany . |
| 196 07 500 | 3/1996 | Germany . |
| 5-167388 | 7/1993 | Japan . |
| 92-14008 | 7/1992 | Rep. of Korea . |
| 95-700634 | 1/1995 | Rep. of Korea . |

OTHER PUBLICATIONS

"IEEE 1991 Ultrasonics Symposium", Proceedings vol. 1, Sponsored by the Ultrasonics Ferroelectric and Frequency Control Society; Dec. 8–11, 1991.

IEEE Pacific Rim Conference on Communications, Computers and Signal Processing, Proceedings vol. 2 of 2, Co–sponsored by IEEE Victoria Section, IEEE Region 7, The Faculty of Engineering, University of Victoria, May 19–21, 1993.

Translation of Office Action in Korean Patent Application No. 96–35292, dated Jan. 27, 1999.

Primary Examiner—Reinhard J. Eisenzopf
Assistant Examiner—Marsha D. Banks-Harold
Attorney, Agent, or Firm—Nikaido Marmelstein Murray & Oram LLP

[57] ABSTRACT

A filter device includes at least two filter elements provided in a package, each of the filter elements passing only signals within a predetermined frequency band, the predetermined frequency bands of the filter elements having center frequencies which are distinct from each other. An input terminal is connected to and shared by respective inputs of the filter elements. An output terminal is connected to and shared by respective outputs of the filter elements.

11 Claims, 32 Drawing Sheets

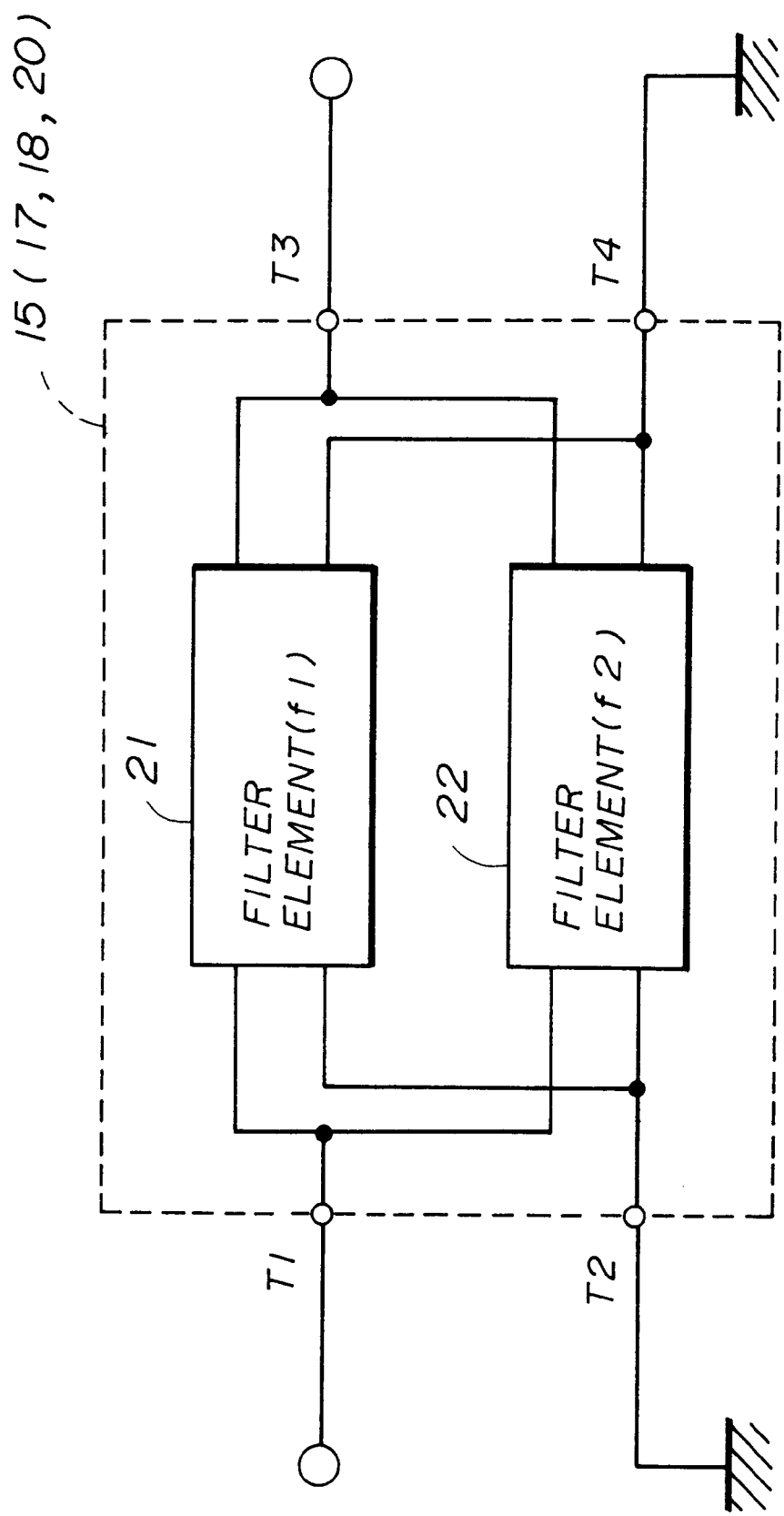

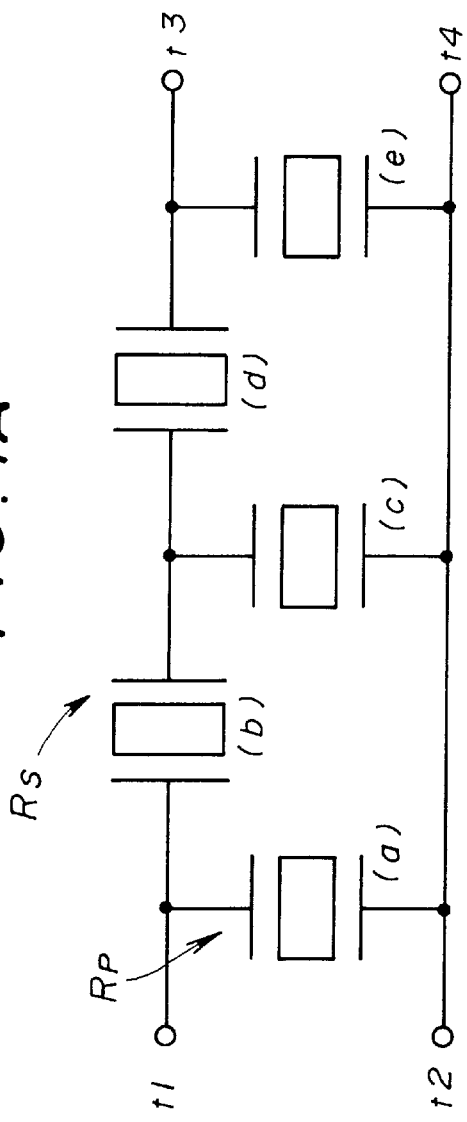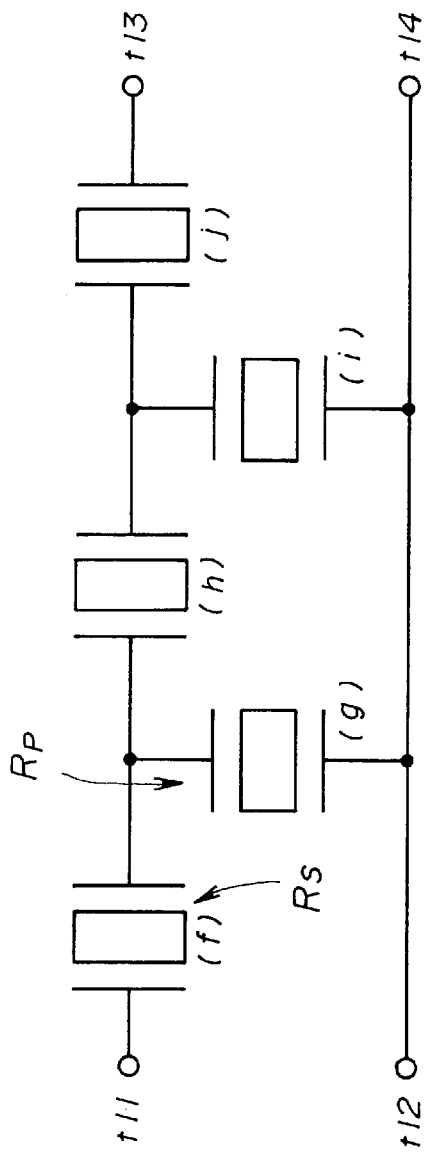

FILTER DEVICE AND DUAL-BAND RADIO SYSTEM IN WHICH THE FILTER DEVICE IS USED

BACKGROUND OF THE INVENTION (1) Field of the Invention

The present invention generally relates to a filter device, and more particularly to a filter device appropriate for use in a dual-band radio system which transmits and receives signals in dual bands.

Small-size, light-weight mobile terminal systems such as automotive telephones or portable telephones have come into widespread use. The number of subscribers of such systems has increased in recent years, and an increase in the number of channels which can be utilized by the mobile terminal systems is required. To meet the requirement, mobile terminal systems which use a wider range of radio frequencies than before have been developed for practical use. In particular, an earlier mobile terminal system utilized a frequency band of around 800 MHz only, and a new mobile terminal system utilizing a frequency band of around 1.5 GHz is in practical use.

More specifically, the earlier mobile terminal system utilizes a transmitting frequency range of 940–960 MHz and a receiving frequency range of 810–830 MHz. The new 1.5-GHz system utilizes a transmitting frequency range of 1.429–1.453 GHz and a receiving frequency range of 1.477–1.501 GHz.

(2) Description of the Related Art

FIG. 1 shows a radio signal portion of a prior art radio system. This system transmits or receives signals within a single frequency band of 800 MHz or 1.5 GHz. Hereinafter, such a mobile terminal system will be called a single-band system.

Referring to FIG. 1, the radio signal portion of the radio system includes an antenna 11, an antenna duplexer 2, a radio signal transmitter (TX) unit 3, and a radio signal receiver (RX) unit 4. In the single-band system, shown in FIG. 1, a modulator unit (not shown) is connected to an input of the TX unit 3, and an output of the RX unit 4 is connected to a demodulator unit (not shown).

The radio signal transmitter (TX) unit 3 receives a transmitting signal from the modulator unit at a filter 5. The filter 5 passes through only signals within a center-frequency band. A power amplifier (PA) 6 amplifies the transmitting signal from the filter 5. A filter 7 passes through only signals within the center-frequency band. The TX unit 3 outputs the transmitting signal from the filter 7 to the antenna duplexer 2 for transmitting the same via the antenna 11.

The radio signal receiver (RX) unit 4 receives a receiving signal from the antenna duplexer 2 at a filter 8. The filter 8 passes through only signals within the center-frequency band. A low-noise amplifier (LNA) 9 amplifies the receiving signal from the filter 8. A filter 10 passes through only signals within the center-frequency band. The RX unit 4 outputs the receiving signal from the filter 10 to the demodulator unit.

The filters 5, 7, 8 and 10 are usually band-pass filters which block all signals but those within a center-frequency band including a predetermined center frequency "fo". The filters 5, 7, 8 and 10 reject noise while passing through only the signals within the center-frequency band.

The single-band system for the 800-MHz band and the single-band system for the 1.5-GHz band, both of which have a construction similar to that of the above-described mobile terminal system, have been separately developed and put into practical use. The 800-MHz system cannot make use of signals within the 1.5-GHz band, and the 1.5-GHz system cannot make use of signals within the 800-MHz band.

A dual-band radio system which can utilize both 800-MHz and 1.5-GHz bands is useful for users. Such a dual-band radio system can make use of signals within one of the 800-MHz and 1.5-GHz bands, the one of the two bands being manually selected. In order to build the above dual-band radio system, some elements may be used in common for both the 800-MHz band and the 1.5-GHz band. However, other elements cannot be shared and must be separately prepared for the dual-band radio system.

For example, in the case of the radio system in FIG. 1, the power amplifier 6 and the low-noise amplifier 9 can be used in common for the above dual-band radio system. However, with respect to the filters 5, 7, 8 and 10, a set of filters for the 800-MHz band and a set of filters for the 1.5-GHz band must be separately prepared to build the above dual-band radio system.

The filters 5, 7, 8 and 10 are packaged parts which are separately prepared. Therefore, in order to build a dual-band radio system, a set of filters for one of the two bands and a set of filters for the other band must be prepared and incorporated. This makes it difficult to construct a dual-band radio system having a small-size, light-weight signal portion. In addition, the two sets of the filters must be assembled to construct the radio signal portion of the radio system, and reliability of the radio signal portion after the assembly becomes low and the cost becomes high. Further, it is difficult to obtain a desired characteristic of band-pass filtering by simply combining the two sets of the filters.

SUMMARY OF THE INVENTION

An object of the present invention is to provide a novel and useful filter device for use in a radio signal portion of a dual-band radio system in which the above-described problems are eliminated.

Another object of the present invention is to provide a filter device which provides good performance of band-pass filtering and allows the construction of a small-size, light-weight radio signal portion of a dual-band radio system.

Still another object of the present invention is to provide a dual-band radio system having a small-size, light-weight radio signal portion with a high reliability and good performance of band-pass filtering by using such filter devices.

The above-mentioned objects of the present invention are achieved by a filter device which includes a package, at least two filter elements, provided in the package, each of the at least two filter elements passing only signals within a predetermined frequency band, the predetermined frequency bands of the filter elements having center frequencies which are distinct from each other, an input terminal connected to and shared by respective inputs of the filter elements, and an output terminal connected to and shared by respective outputs of the filter elements.

The above-mentioned objects of the present invention are achieved by a radio system which includes: a radio signal transmitter unit processing modulated signals at an input of the radio signal transmitter unit to generate a transmitting radio signal at an output of the same, the transmitting radio signal being transmitted to an external station; a radio signal receiver unit processing a signal at an input of the radio signal receiver unit to generate a receiving radio signal at an output of the same; a modulator unit generating the modulated signals at outputs of the modulator unit from processed signals at inputs of the modulator unit through a modulation; a demodulator unit generating demodulated signals at outputs of the demodulator unit from the receiving radio signal from the radio signal receiver unit at an input of the demodulator unit through a demodulation; a base-band signal processor unit generating the processed signals at outputs of the base-band signal processor unit from an audio signal at an input of the base-band signal processor unit through a base-band signal processing, the outputs of the base-band signal processor unit being connected to the inputs of the modulator unit, the signal processor unit having another output at which an audio signal is generated from the demodulated signals at other inputs of the base-band signal processor unit through a base-band signal processing, the other inputs of the base-band signal processor unit being connected to the outputs of the demodulator unit, each of the transmitter unit and the receiver unit including at least one filter device, the filter device of each of the transmitter unit and the receiver unit comprising: a package; at least two filter elements, provided in the package, each of the at least two filter elements passing only signals within a predetermined frequency band, the predetermined frequency bands of the filter elements having center frequencies which are distinct from each other; an input terminal connected to and shared by respective inputs of the filter elements; and an output terminal connected to and shared by respective outputs of the filter elements.

The filter device according to one aspect of the present invention comprises a package, at least two filter elements provided in the package having different center frequencies of predetermined frequency bands, an input terminal connected to and shared by inputs of the filter elements, and an output terminal connected to and shared by outputs of the filter elements. It is possible for the present invention to provide a filter device which provides good performance of band-pass filtering and allows construction of a small-size, light-weight radio signal portion of a dual-band radio system. In addition, it is possible to provide a dual-band radio system in which a small-size, light-weight radio signal portion is constructed by using a plurality of such filter devices therein.

The filter device according to another aspect of the present invention comprises a phase matching unit provided between the input terminal and the inputs of the filter elements, and a phase matching unit provided between the output terminal and the outputs of the filter elements. It is possible for the present invention to obtain a desired characteristic of band-pass filtering of the filter elements by using these phase matching units.

The filter device according to a further aspect of the present invention comprises a single package in which at least two filter elements, each passing only signals within a predetermined frequency band, the frequency bands of the filter elements having center frequencies which are distinct from each other, are provided. The filter device of the present invention has a leadless-chip-carrier structure. It is possible for the present invention to provide a filter device which provides good performance of band-pass filtering and allows construction of a small-size, light-weight radio signal portion of a dual-band radio system. In addition, it is possible to provide a dual-band radio system in which a small-size, light-weight radio signal portion is constructed by using a plurality of such filter devices therein.

BRIEF DESCRIPTION OF THE DRAWINGS

The above and other objects, features and advantages of the present invention will become more apparent from the following detailed description when read in conjunction with the accompanying drawings in which:

FIG. 3 is a block diagram of the filter device of the radio signal portion in FIG. 2;

FIGS. 4A and 4B are circuit diagrams of filter elements of the filter device in FIG. 3;

DETAILED DESCRIPTION OF THE PREFERRED EMBODIMENTS

A description will now be given of the preferred embodiments of the present invention with reference to the accompanying drawings.

Figure 1:
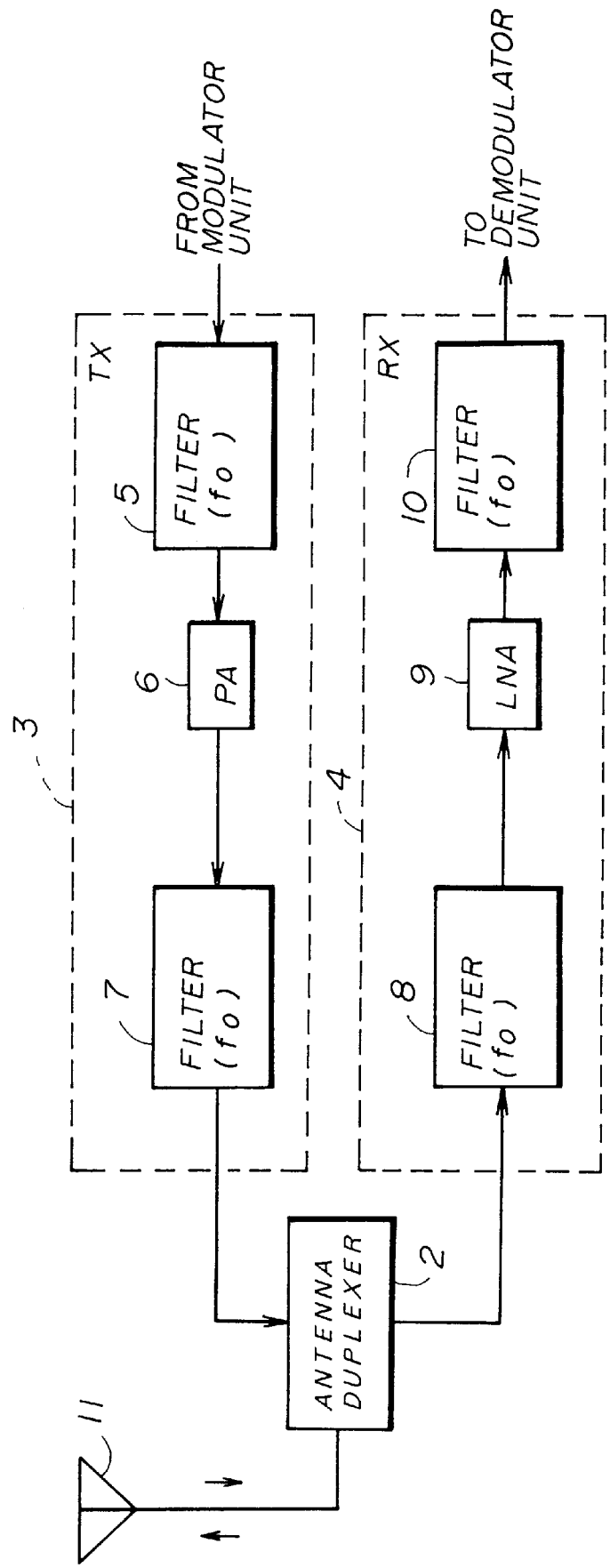
FIG. 1 is a block diagram of a radio signal portion of a prior art radio system.
Figure 2:
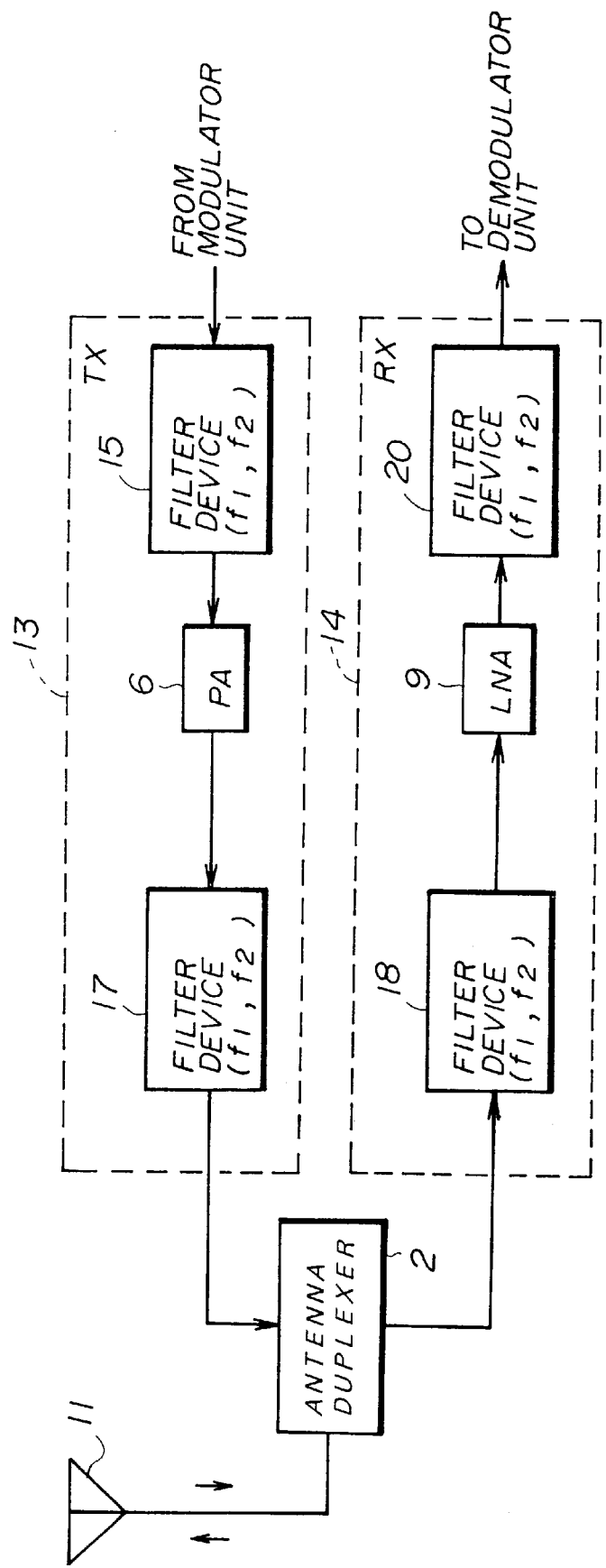
FIG. 2 is a block diagram of a radio signal portion of a radio system in which a filter device in a first embodiment of the present invention is included.

FIG. 2 shows a radio signal portion of a dual-band radio system which includes at least two filter devices in the first embodiment of the present invention. In FIG. 2, the elements which are the same as corresponding elements in FIG. 1 are designated by the same reference numerals, and a description thereof will be omitted.

Referring to FIG. 2, the radio signal portion includes the antenna 11, the antenna duplexer 2, a radio signal transmitter (TX) unit 13, and a radio signal receiver (RX) unit 14. In the dual-band radio system, shown in FIG. 2, a modulator unit (not shown) is connected to an input of the TX unit 13, and an output of the RX unit 14 is connected to a demodulator unit (not shown).

The dual-band radio system described above transmits and receives any signal within the 800-MHz band or within the 1.5-GHz band. In the present embodiment, a desired one of two different antennas for the 800-MHz band and for the 1.5-GHz band is selected and attached to the radio signal portion in FIG. 2. Alternatively, the above-mentioned two antennas and a switching unit (not shown) may be attached to the radio signal portion, and a desired one of the two antennas is selectively connected to the dual-band radio system by using the switching unit.

The radio signal transmitter (TX) unit 13 includes a filter device 15 having an output connected to an input of the power amplifier (PA) 6, and a filter device 17 having an input to which an output of the PA 6 is connected.

The radio signal receiver (RX) unit 14 includes a filter device 18 having an output connected to an input of the low-noise amplifier (LNA) 9, and a filter device 20 having an input to which an output of the LNA 9 is connected.

The above-mentioned filter devices 15, 17, 18 and 20 are band-pass filter devices which block all signals but those within a predetermined frequency band. These units are packaged parts which are separately prepared. Accordingly, the number of elements in the radio signal portion in FIG. 2 is the same as the number of elements in the radio signal portion shown in FIG. 1.

Each of the above filter devices 15, 17, 18 and 20 includes two filter elements, and the filter elements have predetermined frequency bands with center frequencies "f1" and "f2" which are different from each other.

For example, "f1" is the center frequency of the 800-MHz band, and "f2" is the center frequency of the 1.5-GHz band. In the present embodiment, one of the filter elements blocks all signals but those within the 800-MHz band with the center frequency "f1", and the other filter element blocks all signals but those within the 1.5-GHz band with the center frequency "f2".

FIG. 3 shows one of the filter devices 15, 17, 18 and 20 of the radio signal portion in FIG. 2 in the present embodiment. The filter devices 15, 17, 18 and 20 shown in FIG. 2 have the same structure as that of the filter device shown in FIG. 3.

Referring to FIG. 3, the filter device includes a first filter element 21 and a second filter element 22. The first filter element 21 has a predetermined frequency band with the center frequency "f1", and the second filter element 22 has a predetermined frequency band with the center frequency "f2".

The filter device in the present embodiment (which is one of the filter devices 15, 17, 18 and 20 in FIG. 2) is a packaged part which is separately produced. The packaged part is indicated by a dotted line in FIG. 3.

The filter device in FIG. 3 has four terminals T1, T2, T3 and T4. Therefore, this filter device is called a four-terminal, dual-band filter device. The terminals T1 and T2 are input terminals of the filter device which are connected to and shared by inputs of the first and second filter elements 21 and 22. The terminals T3 and T4 are output terminals of the filter device which are connected to and shared by outputs of the first and second filter elements 21 and 22. Also, in the filter device, the terminals T2 and T4 are grounded.

When a signal within the 800-MHz band is input to the input terminal T1 of the filter device in FIG. 3, only the filter element 21 passes this signal and outputs the same to the output terminal T3. When a signal within the 1.5-GHz band is input to the input terminal T1 of the filter device in FIG. 3, only the filter element 22 passes this signal and outputs the same to the output terminal T3. Accordingly, the filter device in FIG. 3 serves as the dual-band filter device.

The filter elements 21 and 22 in the present embodiment are constructed by using surface acoustic wave (SAW) filters. For example, FIG. 4A shows a ladder-type SAW filter element having a predetermined frequency band with the low center frequency "f1", and FIG. 4B shows a ladder-type SAW filter element having another predetermined frequency band with the high center frequency "f2". In both filter elements in FIGS. 4A and 4B, a plurality of SAW resonators are arrayed in a ladder-like formation.

The SAW filter element in FIG. 4A has a parallel SAW resonator Rp (indicated by (a) in FIG. 4A) connected in parallel to input terminals t1 and t2 of the SAW filter element, and has a parallel SAW resonator Rp (indicated by (e) in FIG. 4A) connected in parallel to output terminals t3 and t4 of the SAW filter element.

The SAW filter element in FIG. 4B has a series SAW resonator Rs (indicated by (f) in FIG. 4B) connected in series to an input terminal t11 of the SAW filter element, and has a series SAW resonator Rs (indicated by (j) in FIG. 4B) connected in series to an output terminal t13 of the SAW filter element.

In the SAW filter elements in FIGS. 4A and 4B, a set of parallel SAW resonators Rp and a set of series SAW resonators Rs are provided in a comb pattern of electrodes arrayed on a piezoelectric crystal board in an inter-digital manner. The piezoelectric crystal board is made of, for example, a lithium tantalate material. The electrodes of the comb pattern are made of, for example, an aluminum 2%-copper metal material.

The first filter element 21, as shown in FIG. 4A, has the predetermined frequency band with the low center frequency "f1", and the second filter element 22, as shown in FIG. 4B, has the predetermined frequency band with the high center frequency "f2". These filter elements are constructed by taking into account phase matching of the filter elements, which will be described later.

Figure 5A:
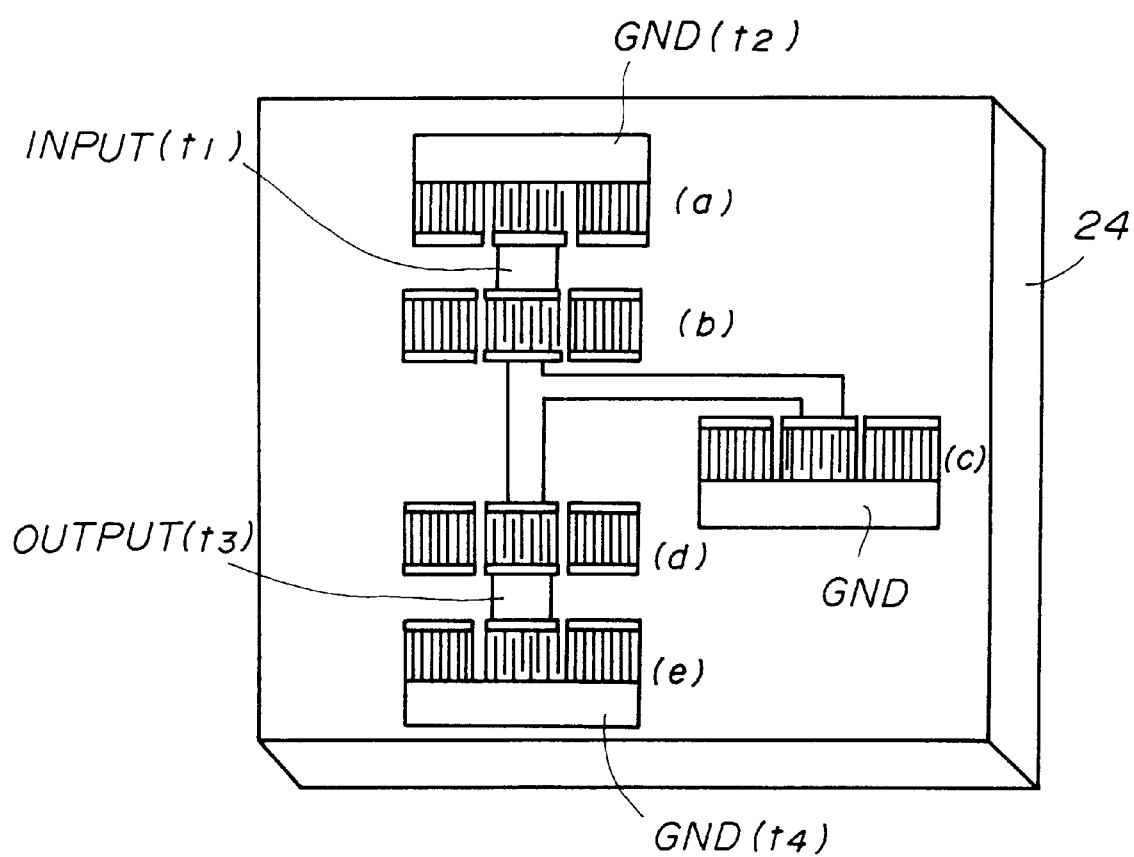
FIGS. 5A and 5B are perspective views of the filter elements in FIGS. 4A and 4B.
Figure 5B:
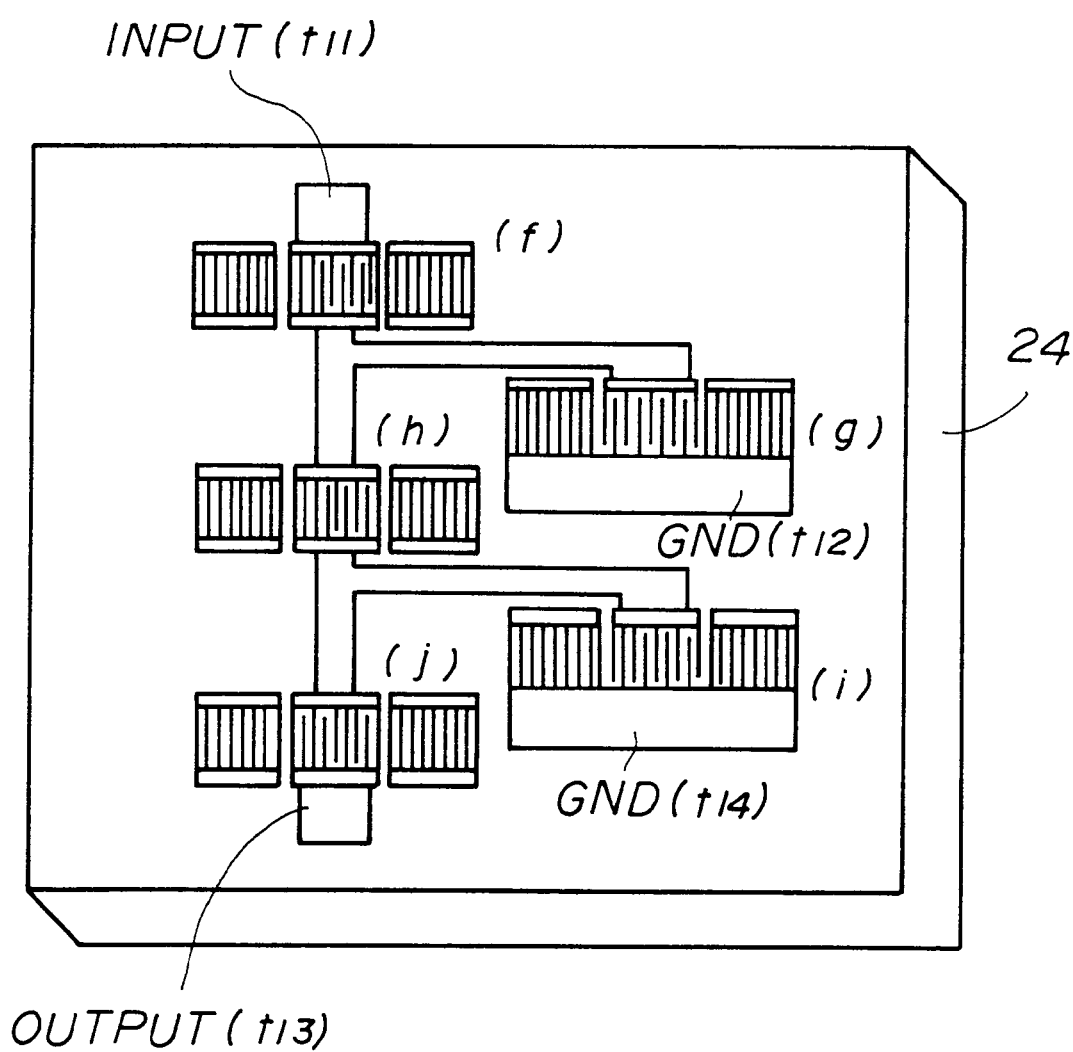

FIG. 5A is a perspective view of the first filter element 21 in FIG. 4A, and FIG. 5B is a perspective view of the second filter element 22 in FIG. 4B.

Referring to FIG. 5A, the filter element 21 is constructed with the parallel SAW resonators Rp and the series SAW resonators Rs which are arrayed on the piezoelectric crystal board 24. These resonators are provided in a comb pattern of electrodes arrayed on the piezoelectric crystal board 24 in an inter-digital manner. The electrodes are made of an aluminum 2%-copper metal material. The piezoelectric crystal board 24 is 0.35 mm thick and made of a lithium tantalate material. The resonators indicated by (a) through (e) in FIG. 5A are the same as corresponding resonators (a) through (e) shown in FIG. 4A. Also, the terminals (t1) through (t4) in FIG. 5A are the same as corresponding terminals (t1) and (t4) shown in FIG. 4A.

Figure 6:
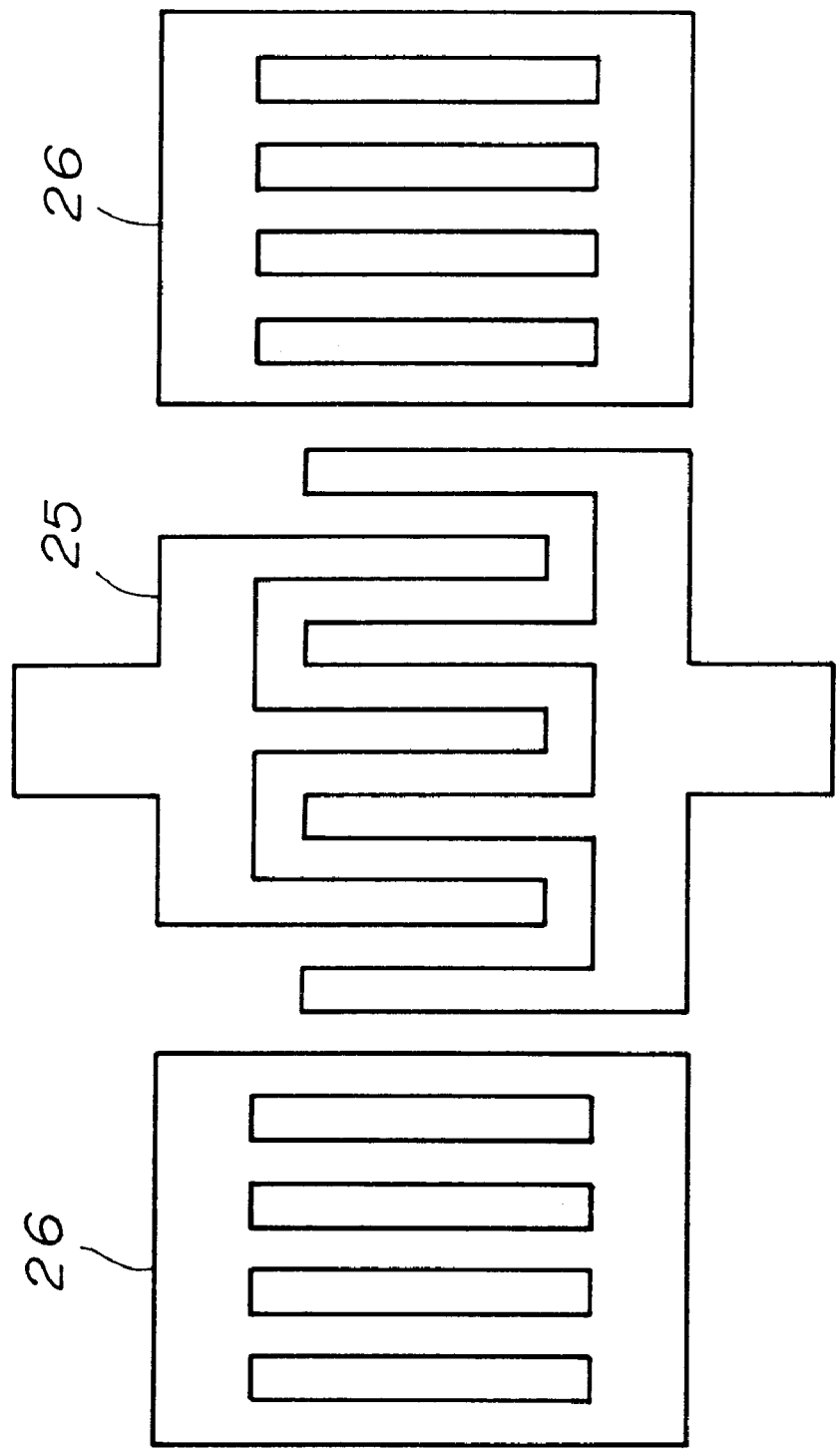
FIG. 6 is an enlarged view of a pattern of electrodes of a series resonator of one of the filter elements in FIGS. 5A and 5B.

FIG. 6 shows a pattern of electrodes of one of the series SAW resonators Rs of the filter elements in FIGS. 5A and 5B. Referring to FIG. 6, the series SAW resonator includes a center electrode 25 and two reflection electrodes 26 on both sides of the center electrode 25. Similarly, the parallel SAW resonator Rp includes a central electrode and two reflection electrodes on both sides of the central electrode. Unlike the series SAW resonator, one of the reflection electrodes of the parallel SAW resonator Rp is grounded. A pattern of the reflection electrodes of the parallel SAW resonator Rp is different from the pattern of the reflection electrodes of the series SAW resonator Rs.

Referring to FIG. 5B, the filter element 22 is constructed with the parallel SAW resonators Rp and the series SAW resonators Rs which are arrayed on the piezoelectric crystal board 24. These resonators are provided in a comb pattern of electrodes arrayed on the piezoelectric crystal board 24 in an inter-digital manner. The electrodes are made of an aluminum 2%-copper metal material. The piezoelectric crystal board 24 is made of a lithium tantalate material. The resonators indicated by (f) through (j) in FIG. 5B are the same as corresponding resonators (f) through (j) shown in FIG. 4B. Also, the terminals (t11) through (t14) in FIG. 5B are the same as corresponding terminals (t1) and (t4) shown in FIG. 4B.

It is known that there are several parameters of the electrodes which are related to reflection characteristics of the resonators. As the specific parameters of the electrodes pertain to a matter of design of the filter element, a description thereof will be omitted.

Figure 7A:
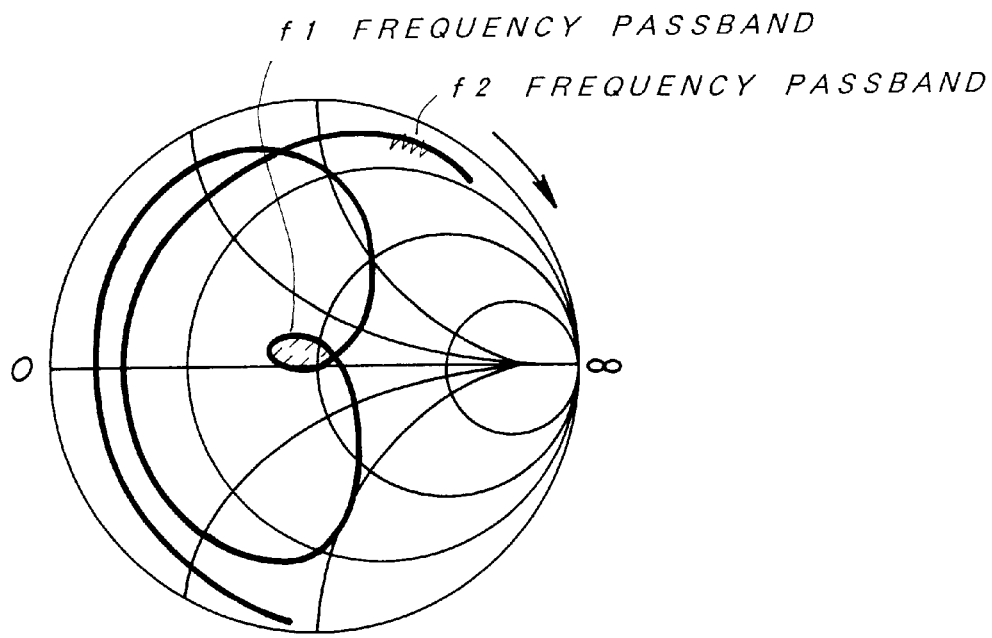
FIGS. 7A and 7B are Smith charts for explaining reflection characteristics of the filter elements in FIGS. 4A and 4B.
Figure 7B:
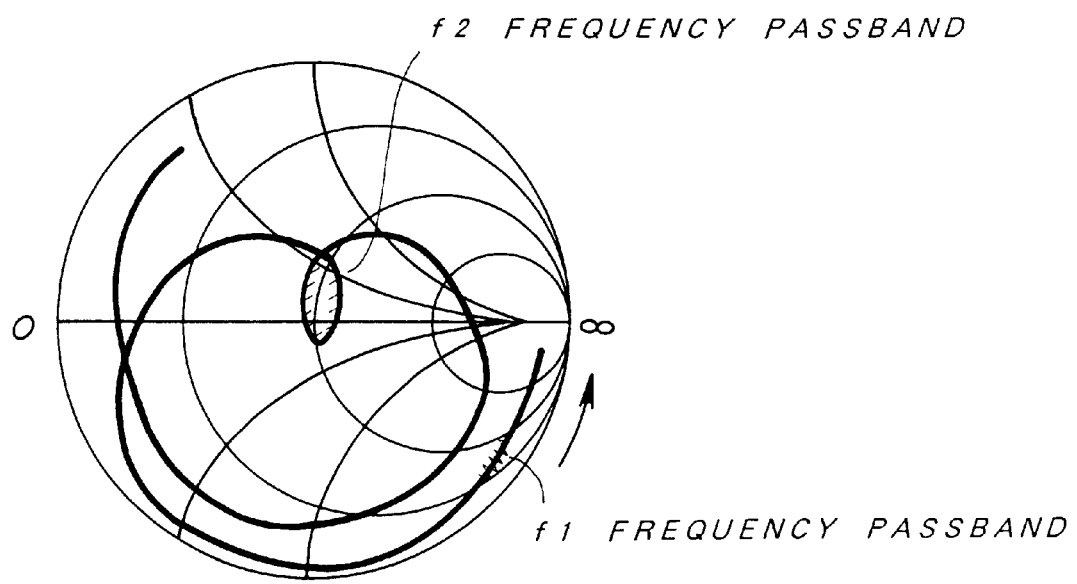

FIG. 7A is a Smith chart showing the reflection characteristics of the filter element 21 in FIGS. 4A and 5A. FIG. 7B is a Smith chart showing the reflection characteristics of the filter element 22 in FIGS. 4B and 5B.

As shown in FIG. 7A, the filter element 21 which has the parallel resonators Rp at the input and output terminals functions as a resistance element (for example, about 50Ω) when the signal is within the "f1" frequency passband. The filter element 21 has a high impedance when the signal is within the "f2" frequency passband (f1<f2).

On the contrary, as shown in FIG. 7B, the filter element 22 which has the series resonators Rs at the input and output terminals functions as the resistance element (for example, about 50Ω) when the signal is within the "f2" frequency passband. The filter element 22 has a high impedance when the signal is within the "f1" frequency passband.

In the filter device (which is one of the filter devices 15, 17, 18 and 20) in the present embodiment, the filter element 21 and the filter element 22 are connected in parallel. In this filter device, the filter element 21 has a low passband frequency (f1), and the filter element 22 has a high passband frequency (f2). Accordingly, the filter element 21 in FIGS. 4A and 5A and the filter element 22 in FIGS. 4B and 5B have good passband characteristics.

As described in the foregoing, the filter device in FIG. 3 is a packaged unit in which the filter elements 21 and 22 are connected in parallel. By incorporating the filter device of the present embodiment into a radio signal portion of a dual-band radio system, it is possible to construct a small-size, light-weight, highly reliable radio signal portion of the dual-band radio system.

However, in order to obtain good passband characteristics of both the filter elements 21 and 22, it is necessary to make use of a phase matching unit for the filter device in FIG. 3. The phase matching unit functions to rotate the phase of the frequency passband in a direction to further make the impedance high (the right phase rotation) when the signal is within the "f2" frequency passband in the case of the filter element 21 in FIGS. 4A and 5A. On the other hand, in the case of the filter element 22 in FIGS. 4B and 5B, the phase matching unit functions to rotate the phase of the frequency passband in a direction to further make the impedance high (the left phase rotation) when the signal is within the "f1" frequency passband. By providing a filter device including the filter elements 21 and 22 and the above phase matching unit, it is possible to obtain good passband characteristics of the band-pass filtering.

It is clearly understood from the Smith charts in FIGS. 7A and 7B that it is difficult to achieve the above phase matching by using a filter device which is built by connecting the filter element 21 having such a construction as shown in FIG. 4B and the filter element 22 having such a construction as shown in FIG. 4A in parallel.

Figure 8:
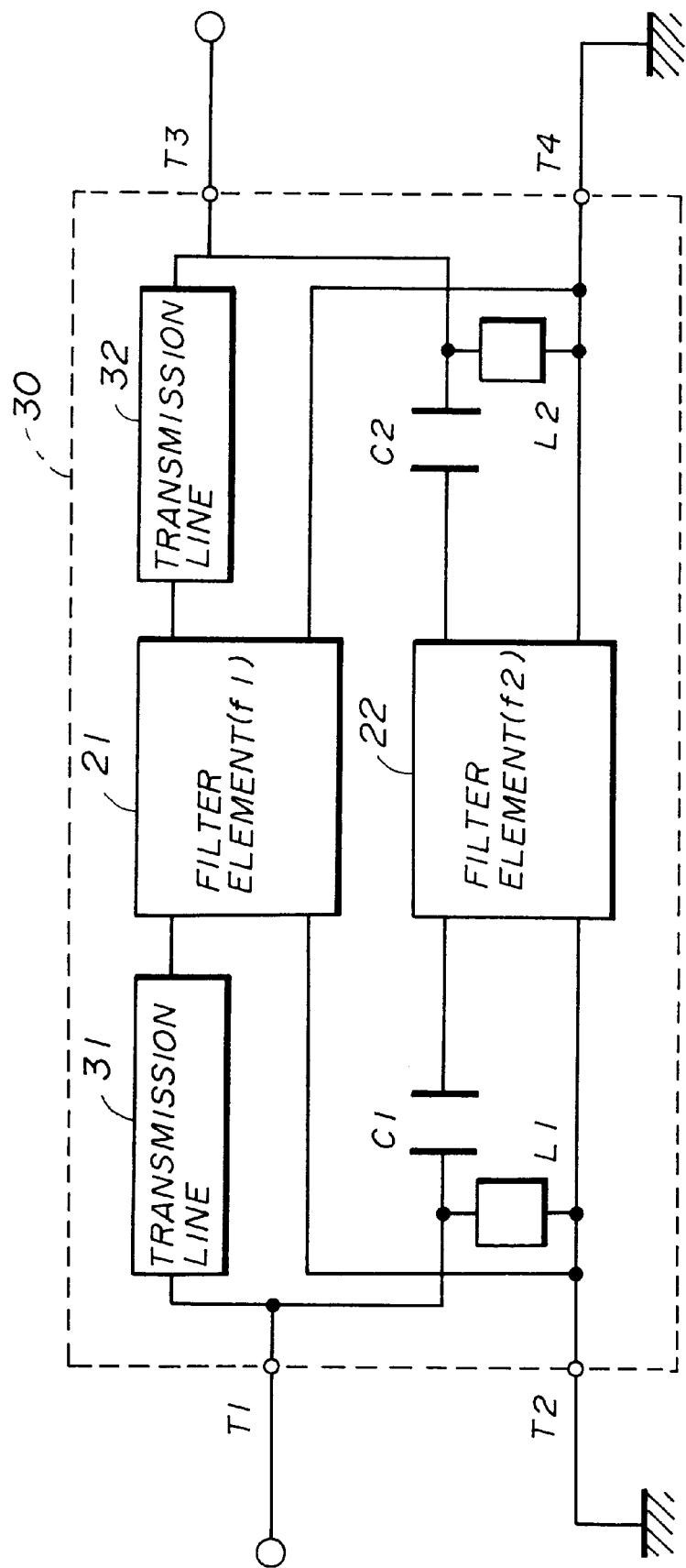
FIG. 8 is a block diagram of a variation of the filter device in FIG. 3, in which a phase matching unit is included in the radio signal portion in FIG. 2.

FIG. 8 shows a variation of the filter device of the first embodiment, in which a phase matching unit is included in the filter device of the radio signal portion in FIG. 2.

Referring to FIG. 8, a filter device 30 includes the phase matching unit in a package thereof, in addition to the filter elements 21 and 22 in the filter device of the first embodiment.

The filter device 30 of the present embodiment includes a transmission line 31, a capacitor C1 and an inductor L1 on the inputs of the filter elements 21 and 22, and includes a transmission line 32, a capacitor C2 and an inductor L2 on the outputs of the filter elements 21 and 22. These elements of the filter device 30 serve as the phase matching unit described above. One end of the transmission line 31 is connected to the input terminal T1 and the other end thereof is connected to the input of the filter element 21. One end of the transmission line 32 is connected to the output of the filter element 21 and the other end thereof is connected to the output terminal T3. The inductor L1 and the capacitor C1 are provided between the input terminal T1 and the input of the filter element 22. The inductor L2 and the capacitor C2 are provided between the output of the filter element 22 and the output terminal T3.

The filter device 30 in FIG. 8 has the above phase matching unit. The phase matching unit functions to rotate the phase of the frequency passband in a direction to further make the impedance high when the signal is within the "f2" frequency passband in the case of the filter element 21. On the other hand, in the case of the filter element 22, the phase matching unit functions to rotate the phase of the frequency passband in a direction to further make the impedance high when the signal is within the "f1" frequency passband. Therefore, in the case of the filter device 30 in FIG. 8, it is possible to obtain good passband characteristics of the filter elements 21 and 22.

Figure 9A:
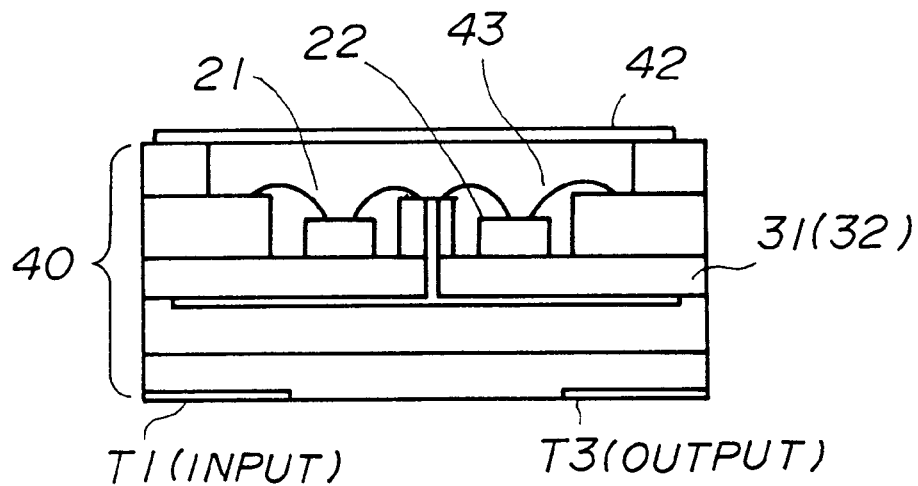
FIGS. 9A and 9B are cross-sectional and perspective views of the filter device in FIG. 8.
Figure 9B:
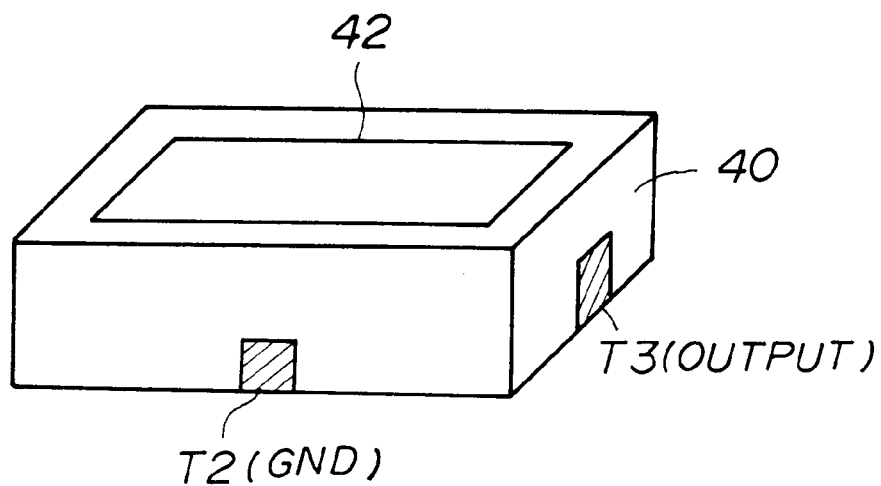

FIGS. 9A and 9B show the filter device in FIG. 8. Referring to FIGS. 9A and 9B, the filter device has a package including a laminated member 40 and a cap 42 on the top of the laminated member 40. The cap 42 is made of a metal material. In another case, the laminated member 40 may be called the package.

The laminated member 40 in the present embodiment is formed such that insulating layers of a ceramic material (for example, alumina) and conductive layers with patterns of lines are alternately laminated. In the laminated member 40, the patterns of the conductive layers can be electrically connected to each other by conductive holes formed in the insulating layers.

In the filter device in FIGS. 9A and 9B, the transmission lines 31 and 32 are formed by using the patterns of the conductive layers in the laminated member 40, and the transmission lines 31 and 32 serve as the phase matching unit. The transmission lines 31 and 32 are connected as shown in FIG. 8 by using the conductive holes of the insulating layers.

As shown in FIG. 9A, the laminated member 40 has recessed portions in which the filter elements 21 and 22 are included. A number of pads are provided on intermediate steps of the recessed portions, and the terminals t1 through t4 of the filter element 21 and the terminals t11 through t14 of the filter element 22 are connected to the pads by using bonding wires 43 made of aluminum. The pads are electrically connected to the patterns of the conductive layers in the laminated member 40 by using the terminals T1 through T4 and the conductive holes of the insulating layers.

The capacitors C1 and C2 and the inductors L1 and L2 are not shown in FIGS. 9A and 9B, but they are disposed at appropriate locations on the recessed portions of the laminated member 40. Accordingly, the filter device 30 in FIG. 8 is constructed by making use of the conductive holes of the insulating layers, the pads, the capacitors, and the inductors in the laminated member 40.

The recessed portions of the laminated member 40 are hermetically enclosed with the cap 42. The terminals T1 through T4 of the filter device in FIGS. 9A and 9B are disposed on bottom and side surfaces of the package of the filter device.

Figure 10A:
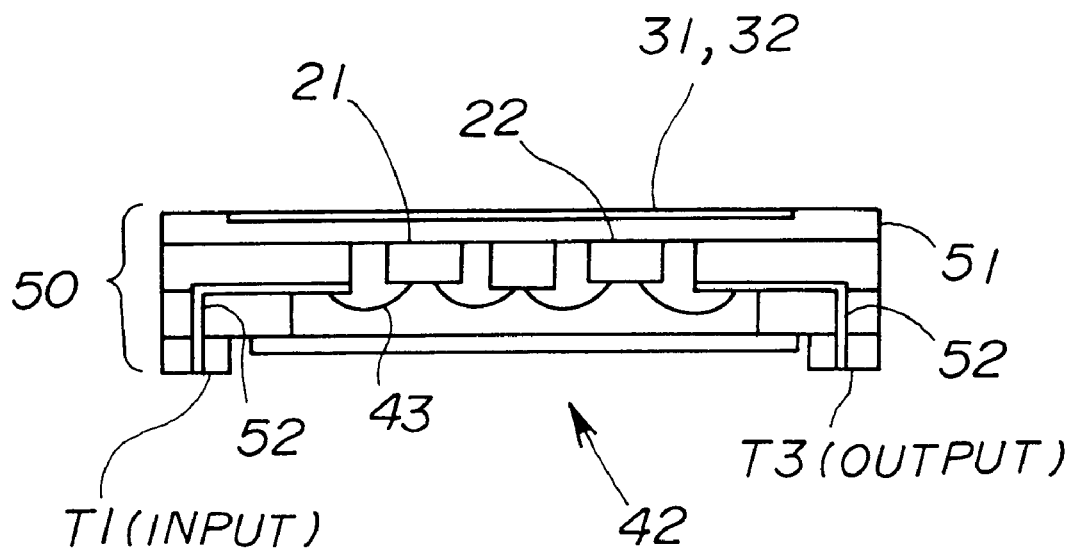
FIGS. 10A and 10B are cross-sectional and perspective views of another variation of the filter device in FIG. 8.
Figure 10B:
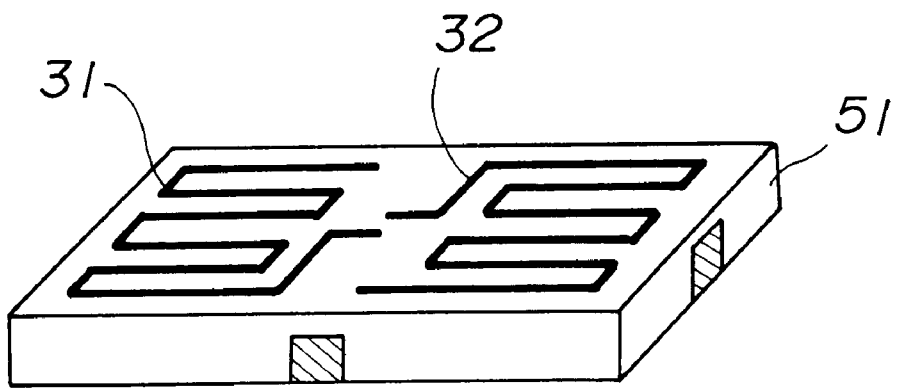

FIGS. 10A and 10B show another variation of the filter device in FIG. 8. Referring to FIGS. 10A and 10B, the filter device has a package including a laminated member 50 and the cap 42 on the bottom of the laminated member 50.

The laminated member 50 in the present embodiment is formed such that insulating layers of a ceramic material (for example, alumina) and conductive layers with patterns of lines are alternately laminated. In the laminated member 50, the patterns of the conductive layers can be electrically connected to each other by conductive holes formed in the insulating layers.

In the filter device in FIG. 10A, the laminated member 50 includes a top insulating layer 51, and the transmission lines 31 and 32 are formed on the top surface of the top insulating layer 51 as shown in FIG. 10B. The filter elements 21 and 22 are formed on the bottom surface of the top insulating layer 51 as shown in FIG. 10A.

As shown in FIG. 10A, the laminated member 50 has recessed portions in which the filter elements 21 and 22 are included. The recessed portions of the laminated member 50 are hermetically sealed with the cap 42. A number of pads are provided on intermediate steps of the recessed portions, and the terminals t1 through t4 of the filter element 21 and the terminals t11 through t14 of the filter element 22 are connected to the pads by using the bonding wires 43. The pads are connected to the patterns of the conductive layers in the laminated member 50 by using the terminals T1 through T4 and the conductive holes of the insulating layers.

As shown in FIG. 10A, the filter device has conductive holes 52 which electrically interconnect the input terminal T1, the output terminal T3 and the internal conductive layer. The capacitors C1 and C2 and the inductors L1 and L2 are not shown in FIG. 10A or FIG. 10B, but they are disposed at appropriate positions on the recessed portions of the laminated member 50.

Figure 11A:
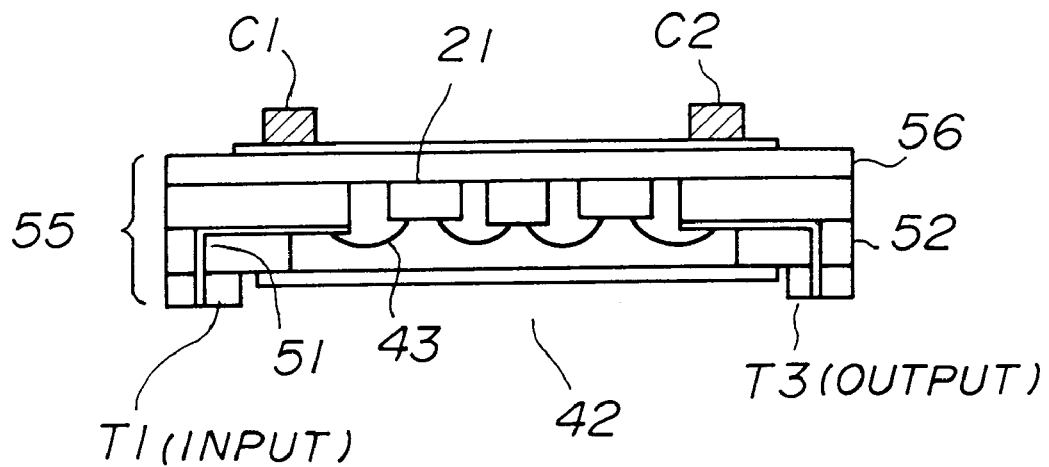
FIGS. 11A and 11B are cross-sectional and perspective views of a further variation of the filter device in FIG. 8.
Figure 11B:
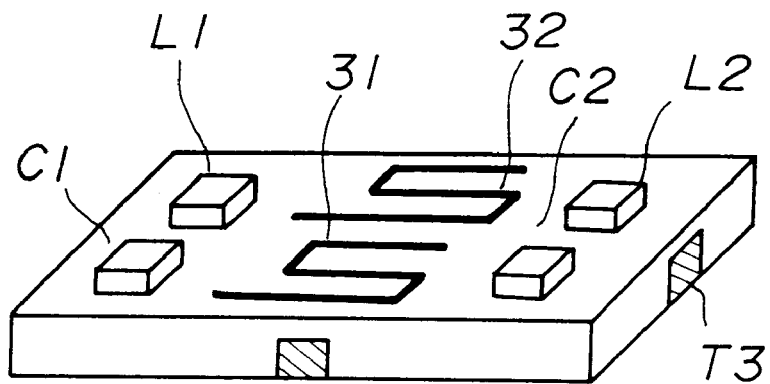

FIGS. 11A and 11B show a further variation of the filter device in FIG. 8.

Referring to FIGS. 11A and 11B, the filter device has a laminated member 55 including a top insulating layer 56 located uppermost in the layers of the laminated member 55. The transmission lines 31 and 32, the capacitors C1 and C2, and the inductors L1 and L2 are disposed on the top surface of the top insulating layer 56, as shown in FIG. 11B. The capacitors C1 and C2 and the inductors L1 and L2 are disposed on the top surface of the top insulating layer 56, which are different from those of the filter device shown in FIGS. 10A and 10B.

The other construction of the filter device in FIGS. 11A and 11B is the same as that of the filter device in FIGS. 10A and 10B.

Since, in the filter device of the present embodiment, the inductors L1 and L2 and the capacitors C1 and C2 are disposed on the top of the laminated member 55, they can be installed or changed after the packaging of the filter device is done.

Figure 12:
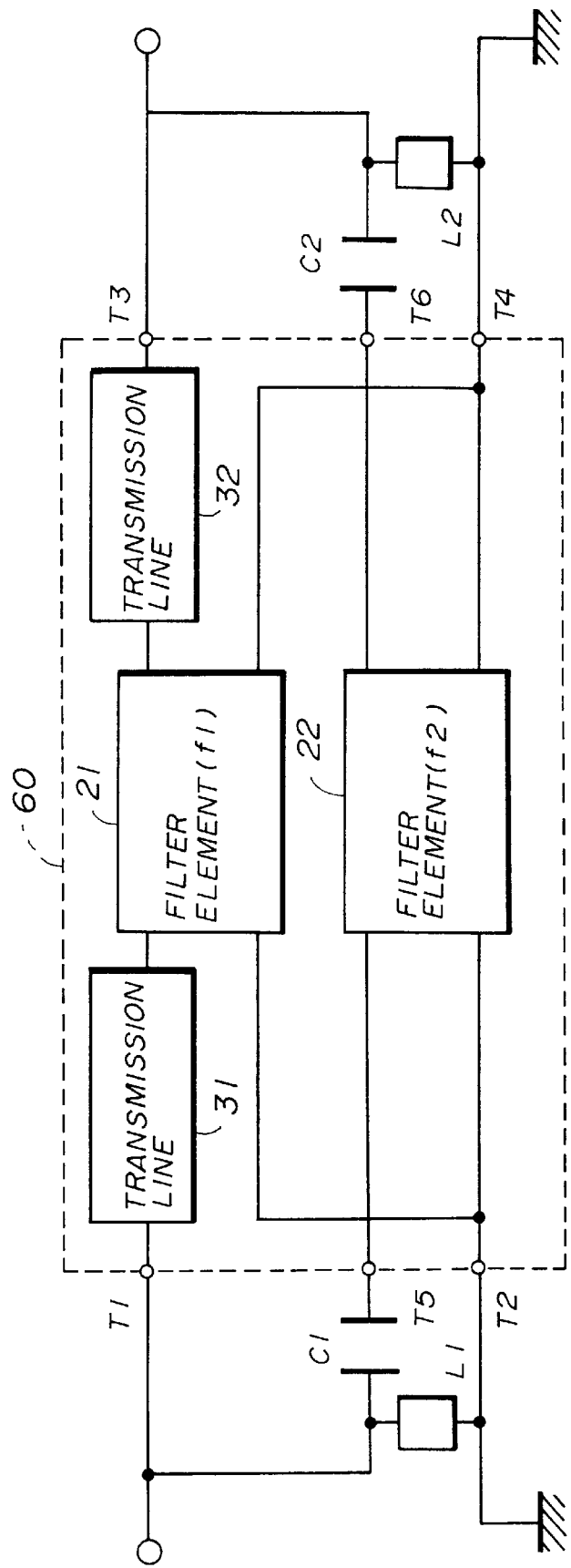
FIG. 12 is a block diagram of another variation of the filter device in FIG. 8.

FIG. 12 shows another variation of the filter device in FIG. 8. Referring to FIG. 12, a filter device 60 in the present embodiment includes the filter elements 21 and 22 and the transmission lines 31 and 32. In this embodiment, the capacitors C1 and C2 and the inductors L1 and L2, which serve as the phase matching unit are externally connected with the filter device 60. These elements in the present embodiment are different from corresponding elements of the filter device in FIG. 8.

In order to enable the inductors L1 and L2 and the capacitors C1 and C2 to be externally connected, the package of the filter device 60 includes an input terminal T5 and an output terminal T6, in addition to the terminals T1, T2, T3 and T4. One end of the capacitor C1 is connected to the input terminal T5, and the input terminal T5 is connected to one input of the filter element 22. The other end of the capacitor C1 is connected to the input terminal T1. Also, one end of the capacitor C2 is connected to the output terminal T6, and the output terminal T6 is connected to one output of the filter element 22. The other end of the capacitor C2 is connected to the output terminal T3. Accordingly, it is possible to perform the phase matching of the filter element 22 by modifying the capacitors C1 and C2 and the inductors L1 and L2 which are externally connected with the filter device 60.

The filter devices of the above-described first embodiment utilize ladder-type surface acoustic wave (SAW) filter elements. Further, the filter device of the present embodiment may utilize multiple-electrode SAW filter elements which are called transversal-type SAW filter elements.

Figure 13:
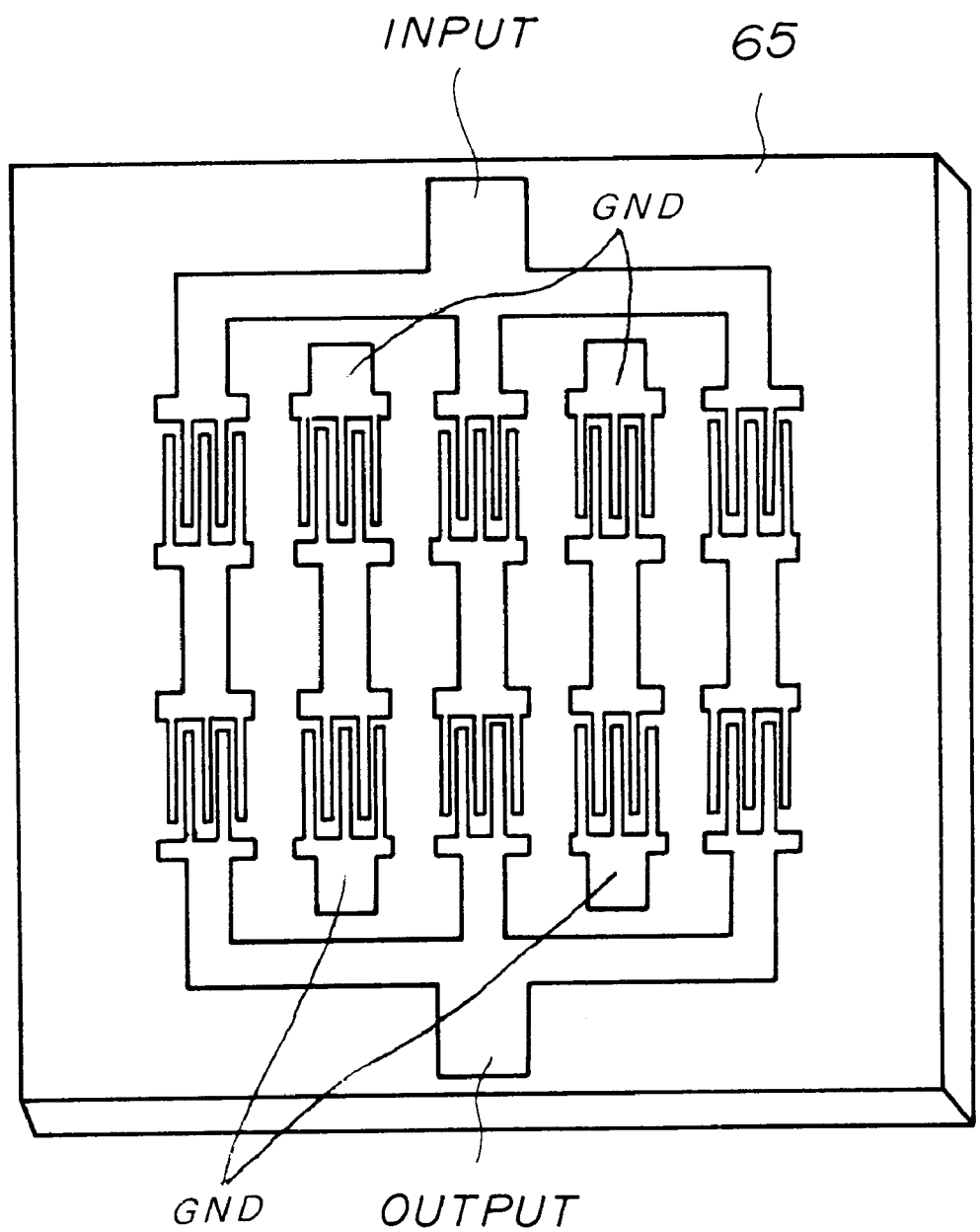
FIG. 13 is a view of another filter element of the filter device according to the present invention.

FIG. 13 shows such a multiple-electrode SAW filter element of the filter device of the present embodiment. Referring to FIG. 13, the multiple-electrode SAW filter element is formed on a piezoelectric crystal board 65 made of a lithium tantalate material. A number of electrodes of the above filter element are formed on the piezoelectric crystal board 65 as shown in FIG. 13.

The size of a dual-band filter device utilizing the above multiple-electrode SAW filter elements can be much smaller than the size of a filter device utilizing dielectric filter elements. In addition, the size of a dual-band filter device utilizing the ladder-type SAW filter elements can be much smaller than the size of the filter device utilizing the dielectric filter elements.

Figure 14:
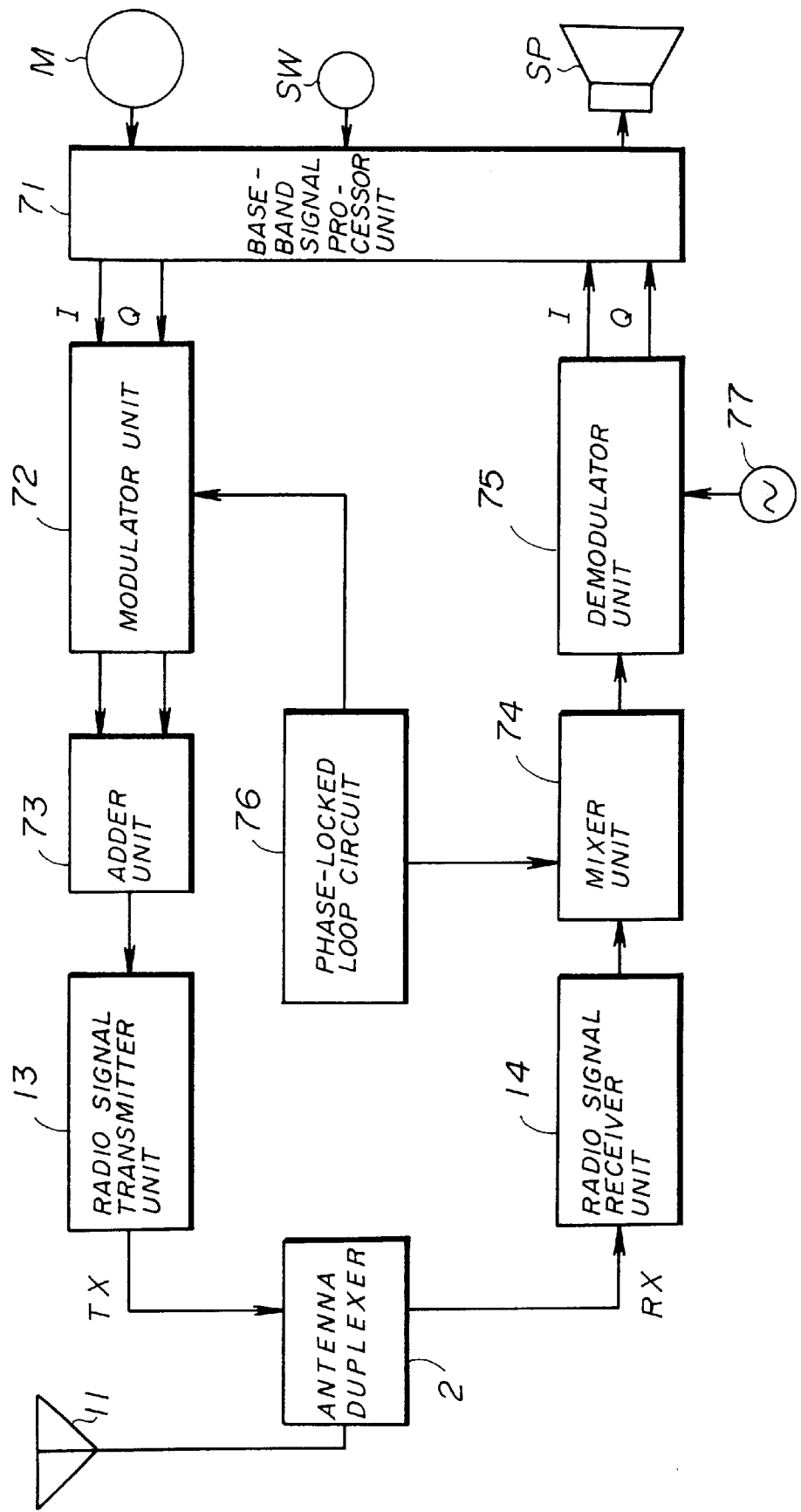
FIG. 14 is a block diagram of a dual-band radio system having radio signal portions in which the filter devices of the first embodiment are included.

FIG. 14 shows a dual-band radio system including a radio signal portion in which the filter device in the above first embodiment is included. In FIG. 14, the elements which are the same as those described above are designated by the same reference numerals, and a description thereof will be omitted.

Referring to FIG. 14, the dual-band radio system comprises a base-band signal processor unit 71, a modulator unit 72, an adder unit 73, the radio signal transmitter (TX) unit 13, the antenna duplexer 2, the antenna 11, the radio signal receiver (RX) unit 14, a mixer unit 74, a demodulator unit 75, a phase-locked loop (PLL) circuit 76 with a local oscillator 77, a microphone unit M, and a speaker unit SP. A power supplying portion of the dual-band radio system, such as a battery unit that supplies power to the above dual-band radio system, is not shown in FIG. 14.

The base-band signal processor unit 71 inputs an audio signal from the microphone M, and generates processed signals "I" and "Q" at its outputs through a base-band signal processing. The modulator unit 72 inputs the processed signals "I" and "Q" from the base-band signal processor unit 71, and generates modulated signals at its outputs through a quadrature amplitude phase modulation at the rate of an oscillation frequency output from the PLL circuit 76.

The adder unit 73 inputs the two modulated signals from the modulator unit 72, and generates a combined signal at its output through addition of the processed signals. The radio signal transmitter (TX) unit 13 inputs the combined signal from the adder unit 73, and generates a transmitting signal at its output. The TX unit 13 includes the above-described filter device of the present invention.

The radio signal receiver (RX) unit 14 receives a radio signal from the antenna duplexer 2. The mixer unit 74 inputs the received radio signal from the RX unit 14, and generates a down-converted signal at its output. The demodulator unit 75 inputs the down-converted signal from the mixer unit 74, and generates demodulated signals "I" and "Q" at its outputs through a demodulation at the rate of an oscillation frequency output from the local oscillator 77.

The base-band signal processor unit 71 inputs the demodulated signals "I" and "Q" from the demodulator unit 75, and generates an audio signal at its output through a base-band signal processing. The speaker SP is operated in accordance with the audio signal output by the base-band signal processor unit 71.

In the above-described dual-band radio system, a switch SW is connected to the base-band signal processor unit 71. A desired one of the 800-MHz band and the 1.5-GHz band for operation of the dual-band radio system can be selected by manually setting the switch SW. The result of the manual setting of the switch SW is transferred from the base-band signal processor unit 71 to the PLL circuit 76 and the local oscillator 77, and a switching of the oscillation frequency for the operation of the dual-band radio system is performed in accordance with the selection of one of the 800-MHz band and the 1.5-GHz band.

The above-described filter device of the present invention is applied to the dual-band radio system having the construction that is shown in FIG. 14. However, the filter device of the present invention can be applied to not only the radio system of the present embodiment but also a radio system having another construction. In addition, the frequency passbands of the radio system to which the present invention is applied are not limited to 800 MHz and 1.5 GHz. It is also possible to provide a filter device which includes a package in which three or more filter elements are included.

Next, a description will be given of a filter device in a second embodiment of the present invention with reference to FIGS. 15 through 17B.

Figure 15:
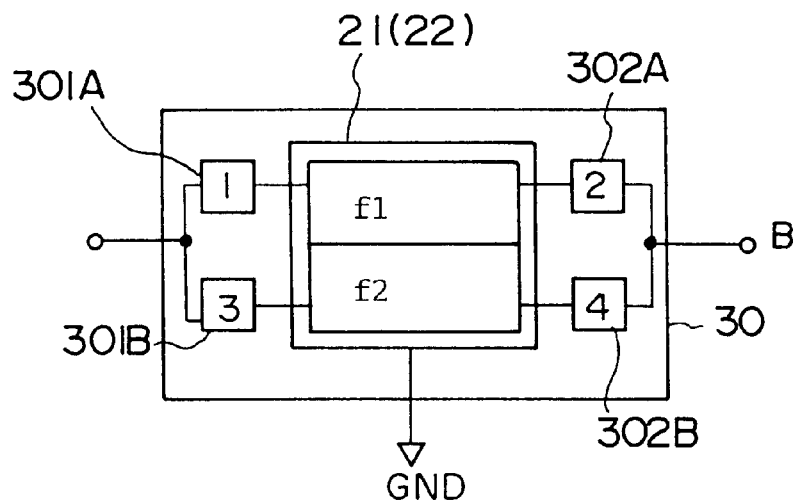
FIG. 15 is a block diagram of a filter device in a second embodiment of the present invention.
Figure 16A:
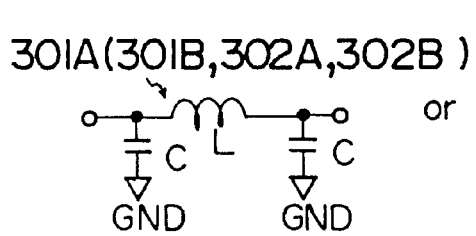
FIGS. 16A and 16B are circuit diagrams of phase matching units of the filter device in FIG. 15.
Figure 16B:
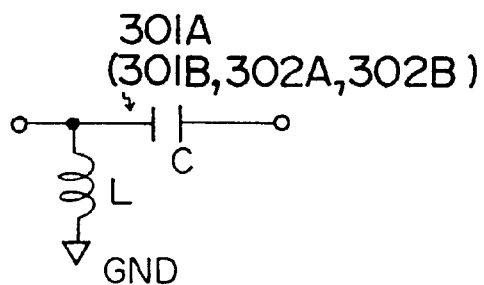
Figure 17A:
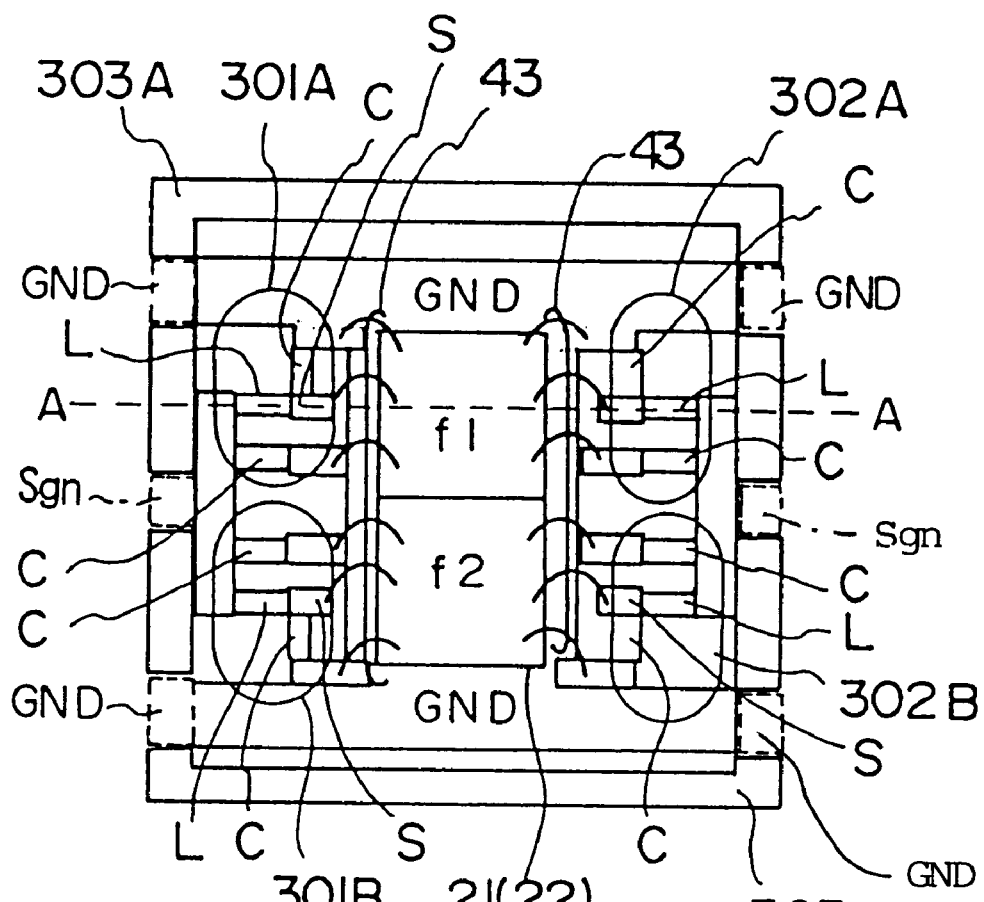
FIGS. 17A and 17B are diagrams showing the construction of the elements of the filter device in FIG. 15.
Figure 17B:
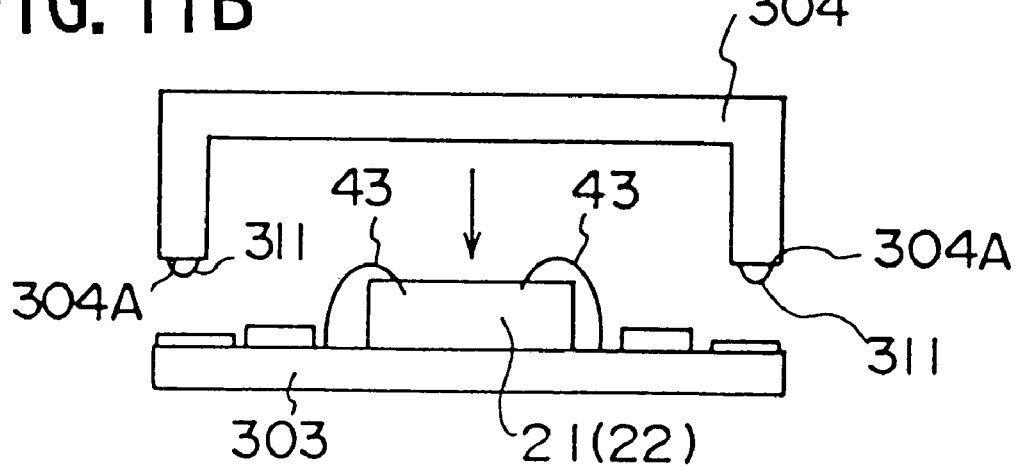

FIG. 15 shows the filter device of the second embodiment. The filter device of the present embodiment has a leadless-chip-carrier structure. FIGS. 16A and 16B are circuit diagrams of one of a plurality of phase matching units of the filter device in FIG. 15. FIGS. 17A and 17B show the construction of the elements of the filter device in FIG. 15.

In FIGS. 15 through 17B, the elements which are the same as corresponding elements of the previous embodiment are designated by the same reference numerals, and a description thereof will be omitted.

As shown in FIG. 15, the filter device includes the filter elements 21 and 22, input phase matching units 301A and 301B, and output phase matching units 302A and 302B. These elements are packaged on a single surface of the package 30.

In the filter device of the present embodiment, the filter elements 21 and 22 respectively pass only signals within predetermined frequency bands having center frequencies f1 and f2 which are distinct from each other. The input phase matching unit 301A is connected to an input (connection terminal) of the filter element 21. The input phase matching unit 301B is connected to an input (connection terminal) of the filter element 22. The output phase matching unit 302A is connected to an output (connection terminal) of the filter element 21. The output phase matching unit 302B is connected to an output (connection terminal) of the filter element 22.

In the filter device of the present embodiment, the filter elements 21 and 22 may be arranged in parallel by using two filter elements having different center frequencies f1 and f2 of the frequency bands. Alternatively, the filter elements 21 and 22 may be arranged on a common piezoelectric crystal board which is similar to the piezoelectric crystal board 65 in FIG. 13.

More specifically, the filter elements 21 and 22 are provided by using the surface acoustic wave (SAW) filter elements which are similar to those described above in the first embodiment with reference to FIGS. 4A and 4B. The SAW filter elements in FIGS. 4A and 4B are ladder-type SAW filter elements in which a plurality of SAW resonators are arrayed in the ladder-like formation.

As described above, the filter elements 21 and 22 have the connection terminals connected to the input phase matching units 301A and 301B, and have the connection terminals connected to the output phase matching units 302A and 302B. At least one of the input phase matching units 301A and 301B and at least one of the output phase matching units 302A and 302B include inductors and capacitors.

The input phase matching units 301A and 301B and the output phase matching units 302A and 302B function to rotate the phase of the frequency passband in a direction to further make the impedance high when the signal is within the "f2" frequency passband in the case of the filter element 21. Thus, the filter element 21 reliably passes only signals within the f1 frequency passband. In the case of the filter element 22, the input phase matching units 301A and 301B and the output phase matching units 302A and 302B function to rotate the phase of the frequency passband in a direction to further make the impedance high when the signal is within the "f1" frequency passband. Thus, the filter element 22 reliably passes only signals within the f2 frequency passband. Accordingly, it is possible for the filter device of the present embodiment to obtain good passband characteristics of the filter elements 21 and 22.

The input phase matching units 301A and 301B and the output phase matching units 302A and 302B may be arranged by using inductors and capacitors in one of a π-shaped formation in FIG. 16A and an L-shaped formation in FIG. 16B. As shown in FIG. 16A, each phase matching unit of the input phase matching units 301A and 301B and the output phase matching units 302A and 302B can be arranged in the π-shaped formation by using a single inductor L and two capacitors C. Alternatively, as shown in FIG. 16B, each phase matching unit of the input phase matching units 301A and 301B and the output phase matching units 302A and 302B can be arranged in the L-shaped formation by using a single inductor L and a single capacitor C.

FIG. 17A shows the elements of the filter device of the present embodiment. The inductors "L" and capacitors "C" of the input phase matching units 301A and 301B, the inductors "L" and capacitors "C" of the output phase matching units 302A and 302B, the filter elements 21 and 22, the signal terminals "Sgn", the grounding terminals "GND", and the wiring electrically interconnecting these elements are packaged on the same surface of a ceramic substrate 303 which is included in the package 30.

The input phase matching units 301A and 301B and the filter elements 21 and 22 are electrically connected by bonding wires 43 of an aluminum material via the connection terminals. Similarly, the output phase matching units 302A and 302B and the filter elements 21 and 22 are electrically connected by the bonding wires 43 via the connection terminals. The wire bonding process is performed to achieve the electrical connections between these elements.

In addition, alumina coating is provided on the filter elements 21 and 22 and on a peripheral portion 303A of the ceramic substrate 303 in order to achieve good sealing between the package 30 and a ceramic cap 304. As shown in FIG. 17B, alumina coating is provided on a sealing surface 304A of the ceramic cap 304. A sealer 311 of a glass material having a low melting point is applied to the sealing surface 304A on which the alumina coating is provided. The sealing surface 304A of the cap 304 and the peripheral portion 303A of the ceramic substrate 303 are heated to a given temperature so that they are bonded to each other. Thus, it is possible for the present embodiment to provide good sealing between the package 30 and the ceramic cap 304.

The filter device of the present embodiment has a single package in which at least two filter elements, each passing only signals within a predetermined frequency band, the frequency bands of the filter elements having center frequencies which are distinct from each other, are provided. It is possible for the present invention to provide a filter device which provides good performance of band-pass filtering and allows the construction of a small-size, light-weight radio signal portion of a dual-band radio system with a high reliability. Further, the filter device in the present embodiment has a leadless-chip-carrier structure, and it is possible to provide a dual-band radio system having a small-size, light-weight radio signal portion with a high reliability.

Next, a description will be given of a filter device in a third embodiment of the present invention with reference to FIGS. 18 through 20E.

Figure 18:
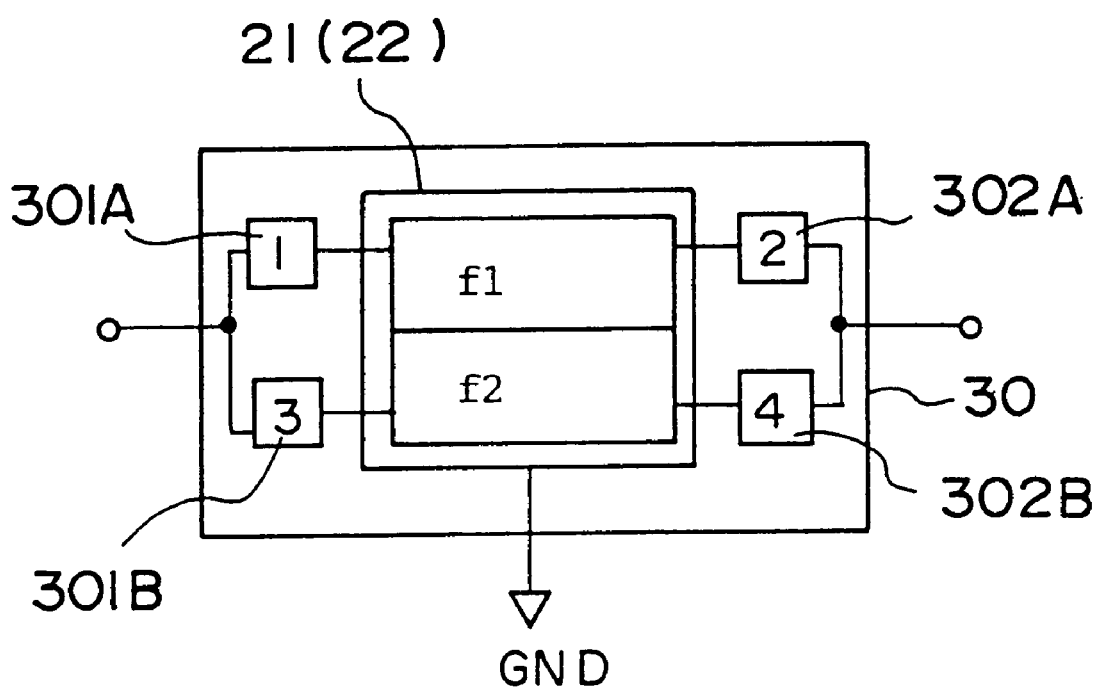
FIG. 18 is a block diagram of a filter device in a third embodiment of the present invention.
Figure 19A:
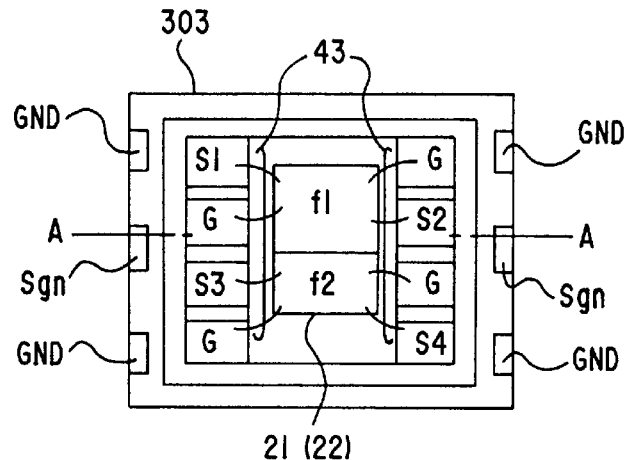
FIGS. 19A, 19B and 19C are diagrams showing the construction of the elements of the filter device in FIG. 18.
Figure 19B:
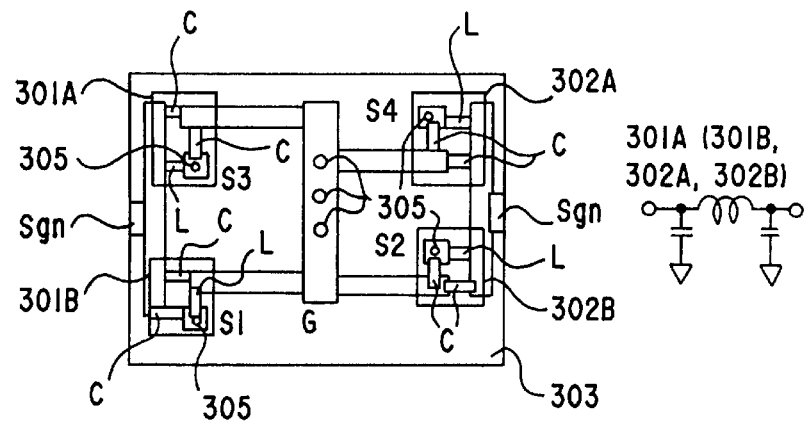
Figure 19C:
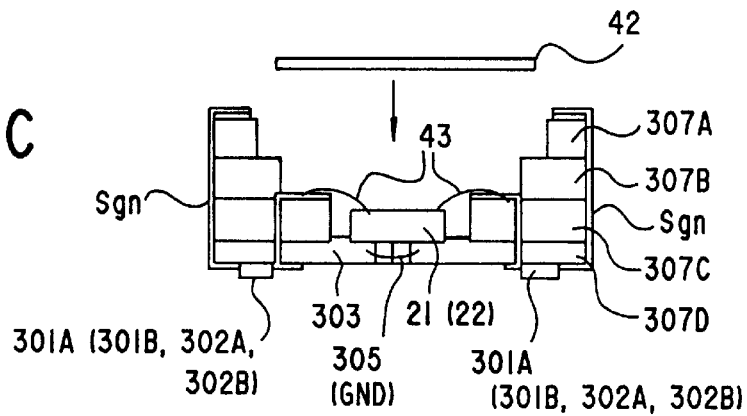

FIG. 18 shows the filter device in the third embodiment. FIGS. 19A, 19B and 19C show the construction of the elements of the filter device in FIG. 18. FIG. 19A is a top view of the filter device of the present embodiment, and FIG. 19B is a bottom view of the filter device of the present embodiment. FIG. 19C is a cross-sectional view of the filter device taken along a line A—A shown in FIG. 19A. FIGS. 20A through 20E show a multi-layer, leadless-chip-carrier structure of the filter device in FIG. 18.

In FIGS. 18 through 20E, the elements which are the same as corresponding elements of the previous embodiment are designated by the same reference numerals, and a description thereof will be omitted.

As shown in FIG. 18, the filter device of the present embodiment includes the elements which are essentially the same as the elements of the previous embodiment. The filter device has a leadless-chip-carrier structure, and comprises the filter elements 21 and 22, the input phase matching units 301A and 301B, and the output phase matching units 302A and 302B.

As shown in FIGS. 19A through 19C, the filter device of the present embodiment has the multi-layer, leadless-chip-carrier structure which includes a first layer 307A, a second layer 307B, a third layer 307C, and a fourth layer 307D. The filter elements 21 and 22 are packaged on the top surface of the ceramic substrate 303 (the fourth layer 307D), and the input phase matching units 301A and 301B and the output phase matching units 302A and 302B are packaged on the bottom surface of the ceramic substrate 303 (the fourth layer 307D) as shown in FIG. 19C.

Similarly to the previous embodiment, each of the input phase matching units 301A and 301B and the output phase matching units 302A and 302B in the present embodiment can be arranged by using a single inductor L and two capacitors C in the π-shaped formation as shown in FIG. 16A. Alternatively, as shown in FIG. 16B, each of the input phase matching units 301A and 301B and the output phase matching units 302A and 302B in the present embodiment can be arranged in the L-shaped formation by using a single inductor L and a single capacitor C.

As shown in FIG. 19A, in the present embodiment, the filter elements 21 and 22, the signal terminals "S1", "S2", "S3" and "S4", the grounding terminals "G", and the wiring electrically interconnecting these elements are packaged on the same surface of the ceramic substrate 303 which is included in the package 30.

The filter elements 21 and 22 in the present embodiment are provided by using the surface acoustic wave (SAW) filter elements which are similar to those described above in the first embodiment with reference to FIGS. 4A and 4B. The SAW filter elements in FIGS. 4A and 4B are the ladder-type SAW filter elements in which a plurality of SAW resonators are arrayed in the ladder-like formation.

As shown in FIG. 19A, the signal terminals S1 and S2, the grounding terminals G, and the filter element 21 (f1) are electrically connected by the bonding wires 43 of the aluminum material via the connection terminals thereof.

Similarly, the signal terminals S3 and S4, the grounding terminals G, and the filter element 22 (f2) are electrically connected by the bonding wires 43 via the connection terminals. The wire bonding process is performed to achieve the electrical connections between these elements of the filter device.

As described above, the filter device of the present embodiment has the leadless-chip-carrier structure, and the signal terminals "Sgn" and the grounding terminals "GND" which are shown in FIGS. 19A and 19B are provided in common on the top and bottom surfaces of the ceramic substrate 303 via the side surfaces thereof as shown in FIG. 19C.

As shown in FIG. 19B, the inductors L and the capacitors C of the input phase matching units 301A and 301B and the output phase matching units 302A and 302B, and the wiring and electrode patterns electrically interconnecting these elements are packaged on the bottom surface of the ceramic substrate 303.

Further, the filter device of the present embodiment has conductive holes 305 which electrically interconnect the signal terminals S1, S2, S3 and S4 on the bottom surface of the ceramic substrate 303 and the signal terminals S1, S2, S3 and S4 on the top surface of the ceramic substrate 303, respectively. Thus, by using the conductive holes 305, the input phase matching unit 301A and the output phase matching unit 302A on the bottom surface of the ceramic substrate 303 can be electrically connected to the filter element 21 (f1) via the connection terminals.

Similarly, the filter elements 21 and 22 on the top surface of the ceramic substrate 303 and the terminals on the bottom surface of the ceramic substrate 303 are electrically interconnected by the conductive holes 305. Thus, by using the conductive holes 305, the input phase matching unit 301B and the output phase matching unit 302B on the bottom surface of the ceramic substrate 303 can be electrically connected to the filter element 22 (f2) via the connection terminals.

Accordingly, it is possible for the present invention to provide a filter device which provides good performance of band-pass filtering and allows the construction of a small-size, light-weight radio signal portion of a dual-band radio system. In addition, it is possible to provide a dual-band radio system in which a reliable, small-size, light-weight radio signal portion is constructed by using a plurality of such filter devices therein.

Further, as shown in FIG. 19C, the filter device of the present embodiment includes the cap 42. The cap 42 is attached to a cap adhesion portion 306 (shown in FIG. 20B) of the second layer 307B so that good adhesion between the ceramic substrate 303 and the cap 42 is achieved.

Figure 20A:
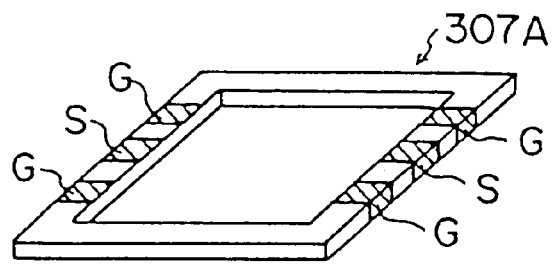
FIGS. 20A through 20E are diagrams showing a multilayer, leadless-chip-carrier structure of the filter device in FIG. 18.
Figure 20B:
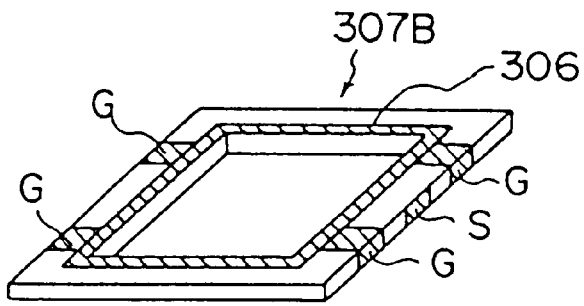
Figure 20C:
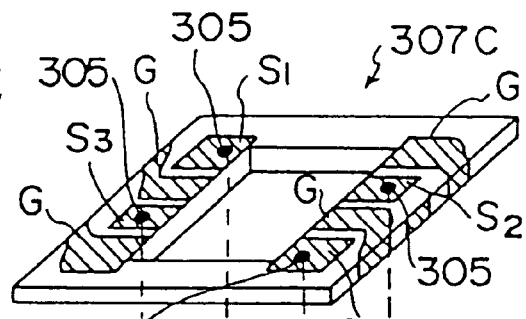
Figure 20D:
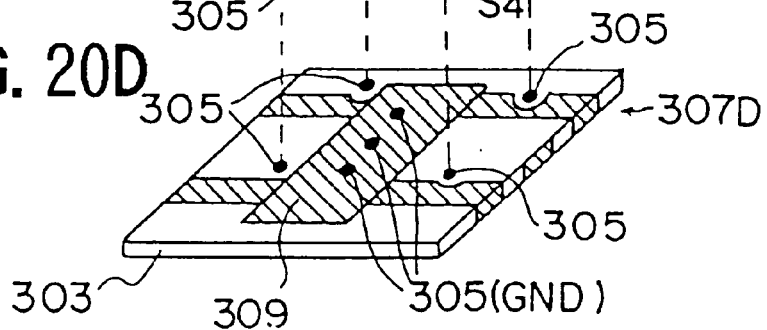
Figure 20E:
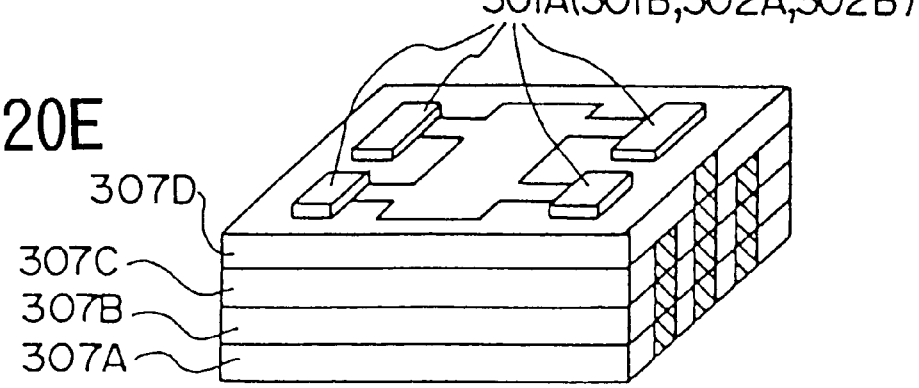

As shown in FIGS. 19C and 20E, in the filter device of the present embodiment, the first layer 307A, the second layer 307B, the third layer 307C, and the fourth layer 307D are laminated together, so that the filter device having the multi-layer, leadless-chip-carrier structure is constructed.

FIG. 20A shows the first layer 307A. As shown, the signal terminals "S" (corresponding to the "Sgn" in FIG. 19A) and the grounding terminals "G" (corresponding to the "GND" in FIG. 19A) are formed on the first layer 307A. The first layer 307A in the present embodiment is made of a ceramic material that is the same as the material of the ceramic substrate 303.

FIG. 20B shows the second layer 307B. As shown, the signal terminals "S" (corresponding to the "Sgn" in FIG. 19A) and the grounding terminals "G" (corresponding to the "GND" in FIG. 19A) are formed on the second layer 307B. In addition, the cap adhesion portion 306 is formed on the second layer 307B. The second layer 307B in this embodiment is made of the ceramic material that is the same as the material of the first layer 307A.

FIG. 20C shows the third layer 307C. As shown, the signal terminals "S1", "S2", "S3" and "S4" and the grounding terminals "G" are formed on the third layer 307C. The conductive holes 305 are formed in the signal terminals "S1", "S2", "S3" and "S4". The third layer 307C in this embodiment is made of a ceramic material that is the same as the material of the second layer 307B.

FIG. 20D shows the fourth layer 307D which is the ceramic substrate 303 described above. As shown, a number of the conductive holes 305 which electrically interconnect the signal terminals S1 through S4 of the third layer 307C and the terminals on the bottom surface of the ceramic substrate 303 are formed in the fourth layer 307D. A chip mounting portion 309 on which the chip of the filter elements 21 and 22 is packaged is formed on the fourth layer 307D. Further, a number of the conductive holes 305 (GND) which electrically interconnect the chip mounting portion 309 and the grounding terminals on the bottom surface of the ceramic substrate 303 are formed in the fourth layer 307D. The fourth layer 307D in the present embodiment is made of the ceramic material as described above.

The filter device of the present embodiment has a single package in which at least two filter elements, each passing only signals within a predetermined frequency band, the frequency bands of the filter elements having center frequencies which are distinct from each other, are provided. It is possible for the present invention to provide a filter device which provides good performance of band-pass filtering and allows the construction of a small-size, light-weight radio signal portion of a dual-band radio system with a high reliability. Further, the filter device of the present embodiment has a leadless-chip-carrier structure, and it is possible to provide a dual-band radio system having a small-size, light-weight radio signal portion with a high reliability.

Figure 21:
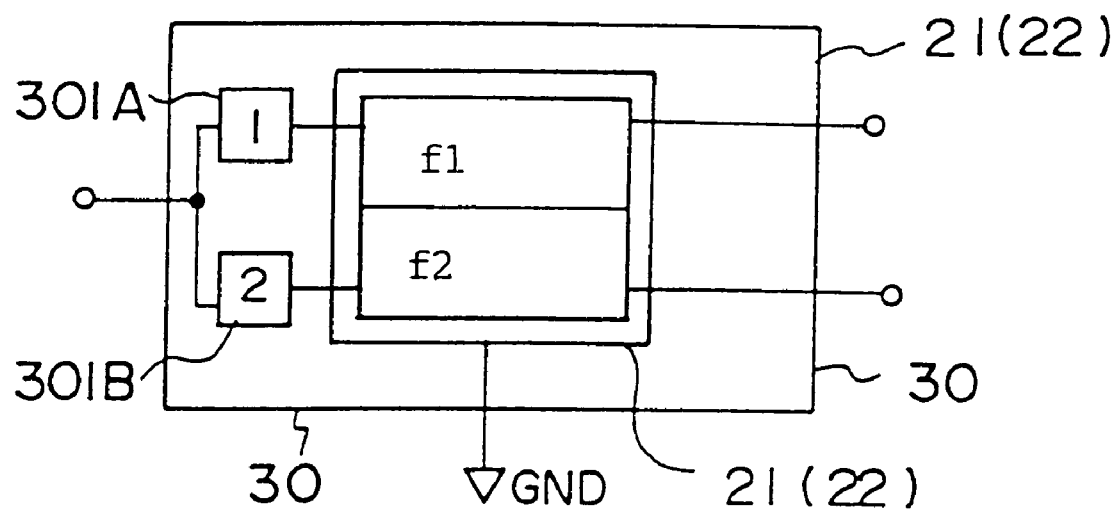
FIG. 21 is a block diagram of a filter device in a fourth embodiment of the present invention.
Figure 22A:
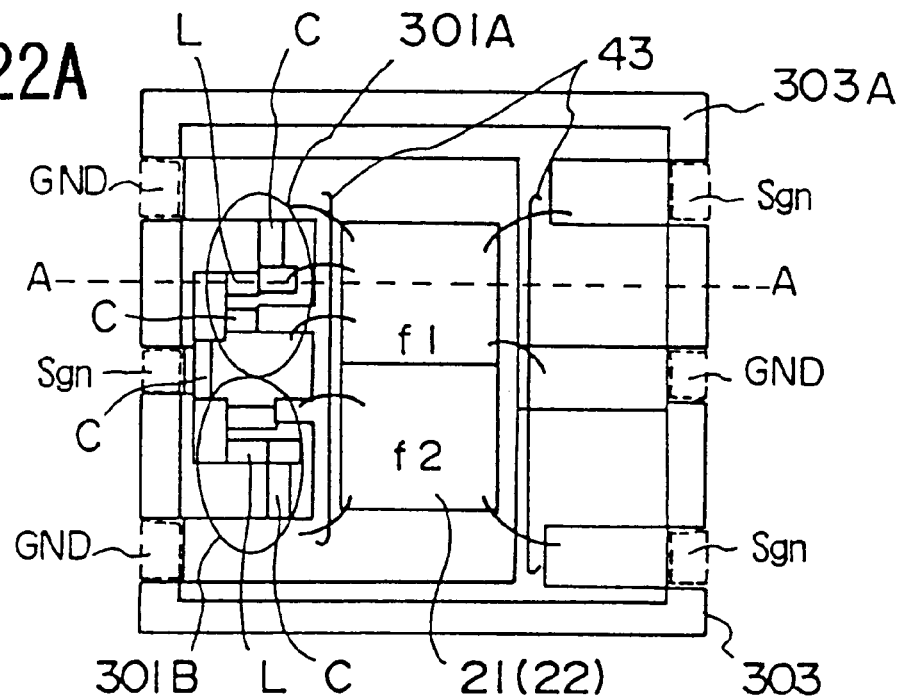
FIGS. 22A and 22B are diagrams showing the construction of the elements of the filter device in FIG. 21.
Figure 22B:
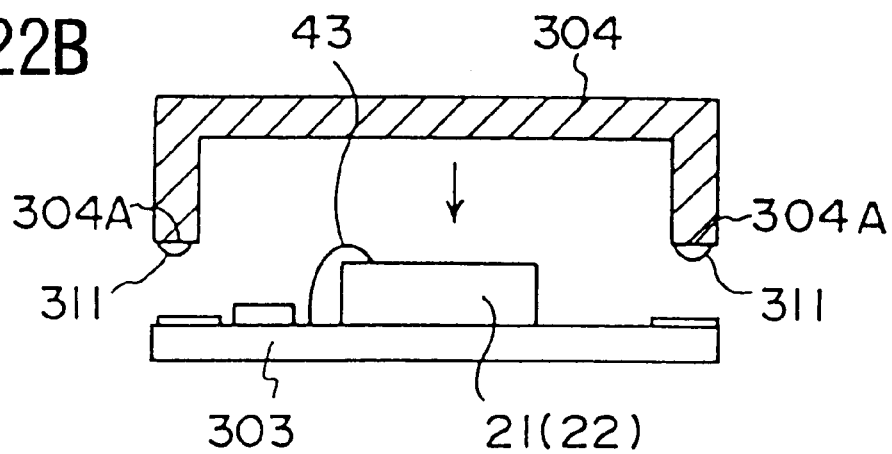

FIG. 21 shows a filter device in a fourth embodiment of the present invention. FIGS. 22A and 22B show the elements of the filter device in FIG. 21.

In FIGS. 21 through 22B, the elements which are the same as corresponding elements of the previous embodiment are designated by the same reference numerals, and a description thereof will be omitted.

As shown in FIG. 21, the filter device of the present embodiment includes the filter elements 21 and 22, the input phase matching units 301A and 301B, and the package 30. The filter elements 21 and 22 and the input phase matching units 301A and 301B are packaged on the same surface of the package 30. The filter device has a leadless-chip-carrier structure in which these elements are packaged.

In the filter device of the present embodiment, the filter elements 21 and 22 respectively pass only signals within predetermined frequency bands having the center frequencies f1 and f2 which are distinct from each other. As shown in FIG. 21, the input phase matching unit 301A is connected to the input (the connection terminal) of the filter element 21. The input phase matching unit 301B is connected to the input (the connection terminal) of the filter element 22.

In the filter device of the present embodiment, the filter elements 21 and 22 may be arranged in parallel by using two filter elements having different center frequencies f1 and f2 of the frequency bands. Alternatively, the filter elements 21 and 22 may be arranged on a common piezoelectric crystal board which is similar to the piezoelectric crystal board 65 in FIG. 13.

More specifically, the filter elements 21 and 22 are provided by using the surface acoustic wave (SAW) filter elements which are similar to those described above in the first embodiment with reference to FIGS. 4A and 4B. The SAW filter elements in FIGS. 4A and 4B are ladder-type SAW filter elements in which a plurality of SAW resonators are arrayed in the ladder-like formation.

As described above, the filter elements 21 and 22 have the connection terminals connected to the input phase matching units 301A and 301B. At least one of the input phase matching units 301A and 301B includes inductors and capacitors.

Each of the input phase matching units 301A and 301B in the present embodiment can be arranged by using a single inductor L and two capacitors C in the π-shaped formation as shown in FIG. 16A. Alternatively, as shown in FIG. 16B, each of the input phase matching units 301A and 301B can be arranged in the L-shaped formation by using a single inductor L and a single capacitor C.

The input phase matching units 301A and 301B function to rotate the phase of the frequency passband in a direction to further make the impedance high when the signal is within the "f2" frequency passband in the case of the filter element 21. Thus, the filter element 21 reliably passes only signals within the f1 frequency passband. In the case of the filter element 22, the input phase matching units 301A and 301B function to rotate the phase of the frequency passband in a direction to further make the impedance high when the signal is within the "f1" frequency passband. Thus, the filter element 22 reliably passes only signals within the f2 frequency passband. Accordingly, it is possible for the filter device of the present embodiment to obtain good passband characteristics of the filter elements 21 and 22.

FIG. 22A shows the elements of the filter device of the present embodiment. The inductors "L" and capacitors "C" of the input phase matching units 301A and 301B, the filter elements 21 and 22, the signal terminals "Sgn", the grounding terminals "GND", and the wiring and electrode patterns electrically interconnecting these elements are packaged on the same surface of the ceramic substrate 303 which is included in the package 30. The leadless-chip-carrier structure of the filter device is formed by using the signal terminals Sgn and the grounding terminals G.

The input phase matching unit 301A and the filter element 21 as well as the input phase matching unit 301B and the filter element 22 are electrically connected by the bonding wires 43 of the aluminum material via the connection terminals of the filter elements 21 and 22. The wire bonding process is performed to achieve the electrical connections between these elements.

In addition, alumina coating is provided on the filter elements 21 and 22 and on the peripheral portion 303A of the ceramic substrate 303 in order to achieve good sealing between the package 30 and the ceramic cap 304. As shown in FIG. 22B, alumina coating is provided on a sealing surface 304A of the ceramic cap 304. A sealer 311 of a glass material having a low melting point is applied to the sealing surface 304A on which the alumina coating is provided. The sealing surface 304A of the cap 304 and the peripheral portion 303A of the ceramic substrate 303 are heated to a given temperature so that they are bonded to each other. Thus, it is possible for the present embodiment to provide good sealing between the package 30 and the ceramic cap 304.

The filter device of the present embodiment has a single package in which at least two filter elements, each passing only signals within a predetermined frequency band, the frequency bands of the filter elements having center frequencies which are distinct from each other, are provided. It is possible for the present invention to provide a filter device which provides good performance of band-pass filtering and allows the construction of a small-size, light-weight radio signal portion of a dual-band radio system with a high reliability. Further, the filter device in the present embodiment has a leadless-chip-carrier structure, and it is possible to provide a dual-band radio system having a small-size, light-weight radio signal portion with a high reliability.

Figure 23:
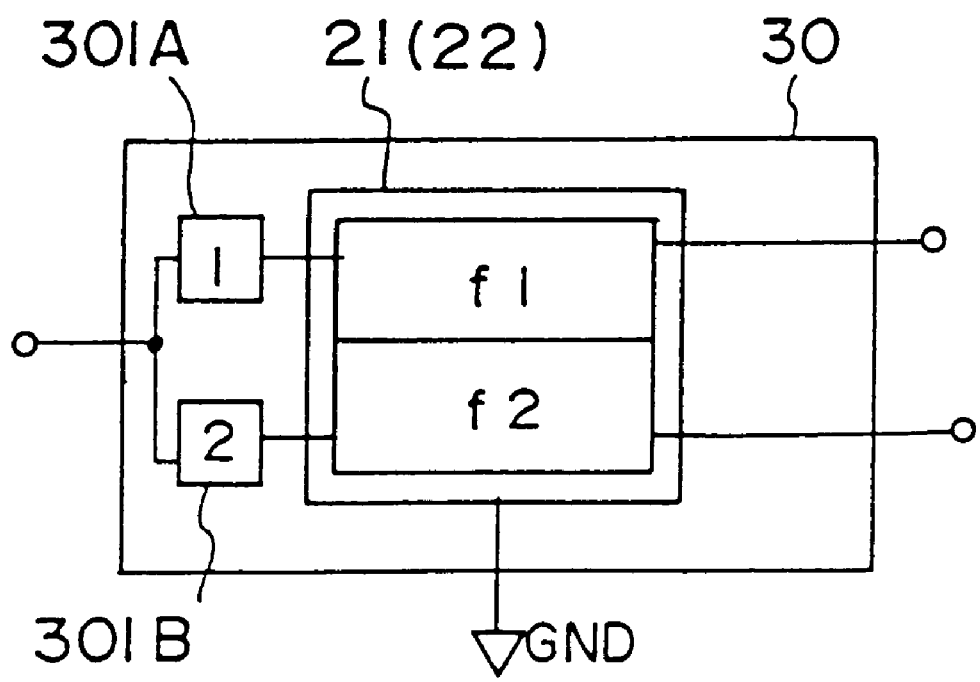
FIG. 23 is a block diagram of a filter device in a fifth embodiment of the present invention.
Figure 24A:
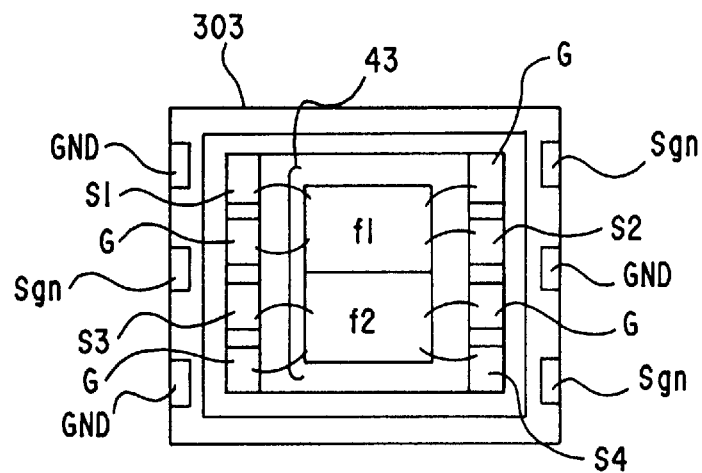
FIGS. 24A, 24B and 24C are diagrams showing the construction of the elements of the filter device in FIG. 23.
Figure 24B:
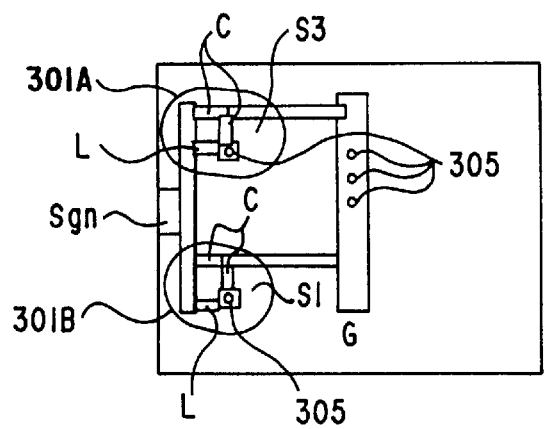
Figure 24C:
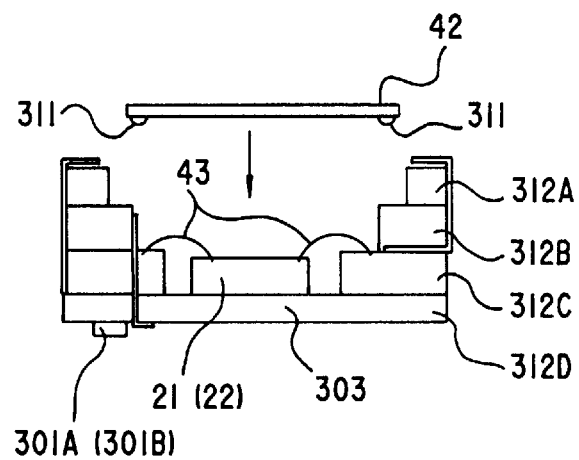

FIG. 23 shows a filter device in a fifth embodiment of the present invention. FIGS. 24A, 24B and 24C show the elements of the filter device in FIG. 23. FIGS. 25A through 25D show the multi-layer, leadless-chip-carrier structure of the filter device in FIG. 23.

In FIGS. 23 through 25D, the elements which are the same as corresponding elements of the previous embodiment are designated by the same reference numerals, and a description thereof will be omitted.

As shown in FIG. 23, the filter device of the present embodiment includes the filter elements 21 and 22, the input phase matching units 301A and 301B, and the package 30. The filter elements 21 and 22 and the input phase matching units 301A and 301B are packaged on the same surface of the package 30. The filter device has a leadless-chip-carrier structure in which these elements are packaged.

In the filter device of the present embodiment, the filter elements 21 and 22 respectively pass only signals within predetermined frequency bands having the center frequencies f1 and f2 which are distinct from each other. As shown in FIG. 23, the input phase matching unit 301A is connected to the input (the connection terminal) of the filter element 21. The input phase matching unit 301B is connected to the input (the connection terminal) of the filter element 22.

In the filter device of the present embodiment, the filter elements 21 and 22 may be arranged in parallel by using two filter elements having different center frequencies f1 and f2 of the frequency bands. Alternatively, the filter elements 21 and 22 may be arranged on a common piezoelectric crystal board which is similar to the piezoelectric crystal board 65 in FIG. 13.

More specifically, the filter elements 21 and 22 are provided by using the surface acoustic wave (SAW) filter elements which are similar to those described above in the first embodiment with reference to FIGS. 4A and 4B. The SAW filter elements in FIGS. 4A and 4B are ladder-type SAW filter elements in which a plurality of SAW resonators are arrayed in the ladder-like formation.

As described above, the filter elements 21 and 22 have the connection terminals connected to the input phase matching units 301A and 301B. At least one of the input phase matching units 301A and 301B includes inductors and capacitors.

Each of the input phase matching units 301A and 301B in the present embodiment can be arranged by using a single inductor L and two capacitors C in the π-shaped formation as shown in FIG. 16A. Alternatively, as shown in FIG. 16B, each of the input phase matching units 301A and 301B can be arranged in the L-shaped formation by using a single inductor L and a single capacitor C.

The input phase matching units 301A and 301B function to rotate the phase of the frequency passband in a direction to further make the impedance high when the signal is within the "f2" frequency passband in the case of the filter element 21. Thus, the filter element 21 reliably passes only signals within the f1 frequency passband. In the case of the filter element 22, the input phase matching units 301A and 301B function to rotate the phase of the frequency passband in a direction to further make the impedance high when the signal is within the "f1" frequency passband. Thus, the filter element 22 reliably passes only signals within the f2 frequency passband. Accordingly, it is possible for the filter device of the present embodiment to obtain good passband characteristics of the filter elements 21 and 22.

FIG. 24A shows the elements of the filter device of the present embodiment. In the present embodiment, the filter elements 21 and 22, the signal terminals S1, S2, S3 and S4, the grounding terminals G, and the wiring and electrode patterns electrically interconnecting these elements are packaged on the top surface of the ceramic substrate 303 which is included in the package 30.

The signal terminals S1 and S2 and the grounding terminals G are electrically connected to the filter element 21 by the bonding wires 43 of the aluminum material via the connection terminals of the filter element 21. Similarly, the signal terminals S3 and S4 and the grounding terminals G are electrically connected to the filter element 22 by the bonding wires 43 via the connection terminals of the filter element 22. The wire bonding process is performed to achieve the electrical connections between these elements.

As described above, the filter device of the present embodiment has a leadless-chip-carrier structure, and the signal terminals "Sgn" and the grounding terminals "GND", which are shown in FIGS. 24A and 24B, are provided on the top and bottom surfaces of the ceramic substrate 303 via the side surfaces thereof as shown in FIG. 24C.

FIG. 24B shows the electrode pattern on the bottom surface of the ceramic substrate 303. The inductors "L" and capacitors "C" of the input phase matching units 301A and 301B, and the wiring and electrode pattern electrically interconnecting these elements are packaged on the bottom surface of the ceramic substrate 303 which is included in the package 30.

As shown in FIGS. 24B and 24C, the filter device of the present embodiment includes the conductive holes 305 which electrically interconnect the signal terminals S1, S2, S3 and S4 on the bottom surface of the ceramic substrate 303 and the signal terminals S1, S2, S3 and S4 on the top surface of the ceramic substrate 303. Thus, by using the conductive holes 305, the filter elements 21 and 22 on the top surface of the ceramic substrate 303 and the filter elements 301A and 301B on the bottom surface of the ceramic substrate 303 are electrically connected to each other.

Further, as shown in FIG. 24C, the filter device of the present embodiment includes the cap 42. Using the sealer 311 primarily containing gold and tin, the cap 42 is attached to the cap adhesion portion 316 (shown in FIG. 25B) of the second layer 312B so that good adhesion between the ceramic substrate 303 and the cap 42 is achieved.

In the filter device of the present embodiment, the first layer 312A, the second layer 312B, the third layer 312C, and the fourth layer 312D are laminated together, so that the filter device having the multi-layer, leadless-chip-carrier structure is constructed. The filter device of the present embodiment having the leadless-chip-carrier structure is useful in that it can be directly packaged on a substrate of a printed-circuit board. It is possible for the present invention to provide a dual-band radio system having a small-size, light-weight radio signal portion with a high reliability by using such filter devices.

Figure 25A:
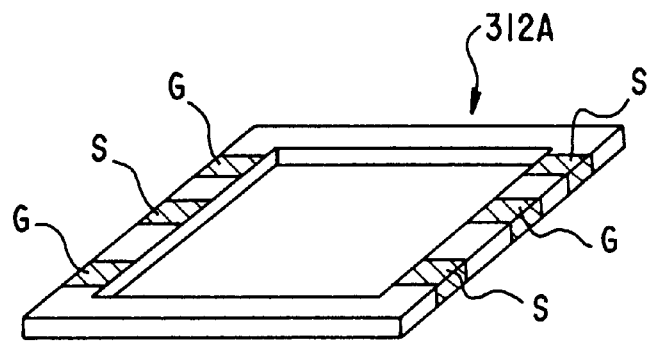
FIGS. 25A through 25D are diagrams showing a multilayer, leadless-chip-carrier structure of the filter device in FIG. 23.

FIG. 25A shows the first layer 312A. As shown, the signal terminals "S" (corresponding to the "Sgn" in FIG. 23A) and the grounding terminals "G" (corresponding to the "GND" in FIG. 23A) are formed on the first layer 312A. The first layer 312A in the present embodiment is made of a ceramic material that is the same as the material of the ceramic substrate 303.

Figure 25B:
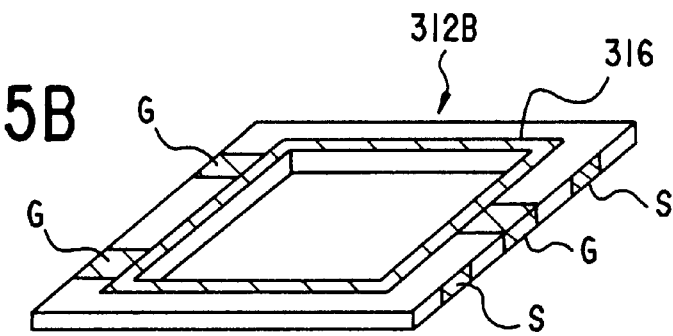

FIG. 25B shows the second layer 312B. As shown, the signal terminals "S" (corresponding to the "Sgn" in FIG. 23A) and the grounding terminals "G" (corresponding to the "GND" in FIG. 23A) are formed on the second layer 312B. In addition, the cap adhesion portion 316 is formed on the second layer 316B. The second layer 312B in this embodiment is made of the ceramic material that is the same as the material of the first layer 312A.

Figure 25C:
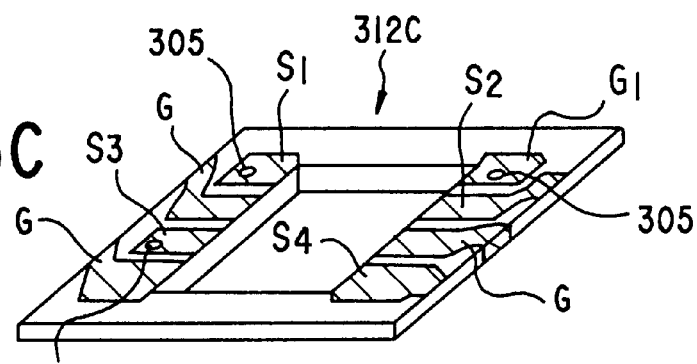

FIG. 25C shows the third layer 312C. As shown, the signal terminals "S1", "S2", "S3" and "S4" and the grounding terminals "G" are formed on the third layer 312C. The conductive holes 305 are formed in the signal terminals "S1", "S2", "S3" and "S4". The wire bonding process for the third layer 312C is performed. The third layer 312C in this embodiment is made of a ceramic material that is the same as the material of the second layer 312B.

Figure 25D:
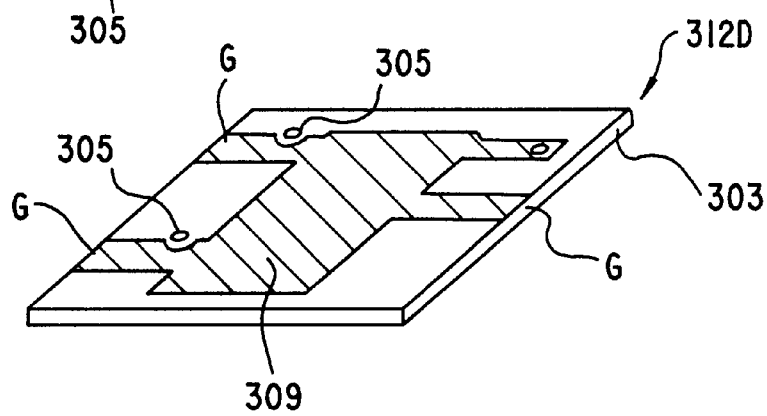

FIG. 25D shows the fourth layer 312D which is the ceramic substrate 303 described above. As shown, a number of the conductive holes 305 which electrically interconnect the signal terminals S1 through S4 of the third layer 312C and the electrode patterns on the bottom surface of the ceramic substrate 303 are formed in the fourth layer 312D. The chip mounting portion 309 on which the chip of the filter elements 21 and 22 is packaged is formed on the fourth layer 312D. Further, a number of the conductive holes 305 (GND) which electrically interconnect the chip mounting portion 309 and the grounding terminals G on the bottom surface of the ceramic substrate 303 are formed in the fourth layer 312D. The fourth layer 312D in this embodiment is made of the ceramic material as described above.

The filter device of the present embodiment has a single package in which at least two filter elements, each passing only signals within a predetermined frequency band, the frequency bands of the filter elements having center frequencies which are distinct from each other, are provided. It is possible for the present invention to provide a filter device which provides good performance of band-pass filtering and allows the construction of a small-size, light-weight radio signal portion of a dual-band radio system with a high reliability. Further, the filter device in the present embodiment has a leadless-chip-carrier structure, and it is possible to provide a dual-band radio system having a small-size, light-weight radio signal portion with a high reliability.

Figure 26:
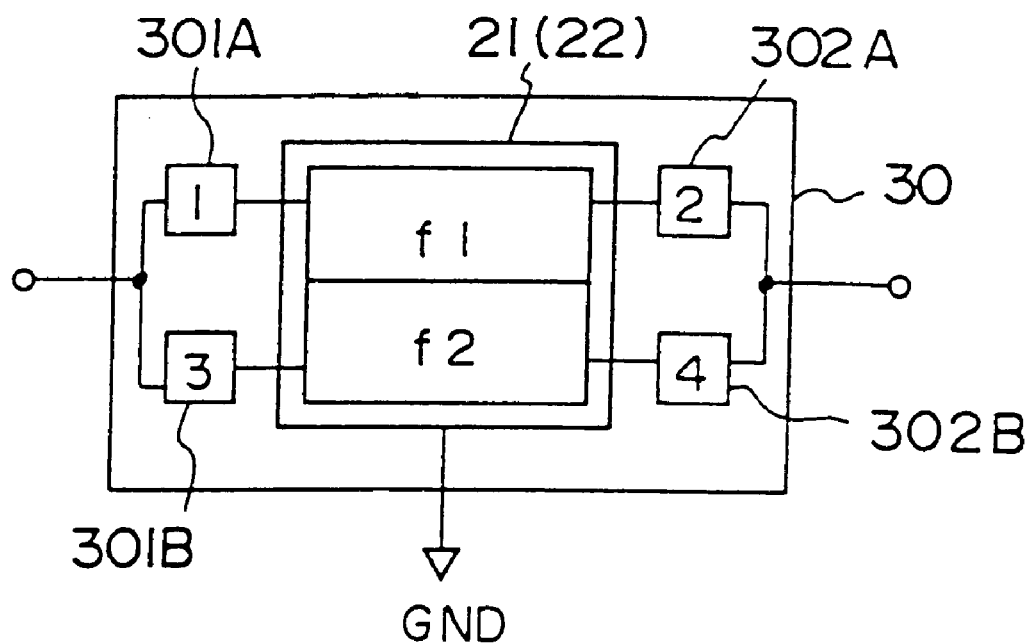
FIG. 26 is a block diagram of a filter device in a sixth embodiment of the present invention.
Figure 27A:
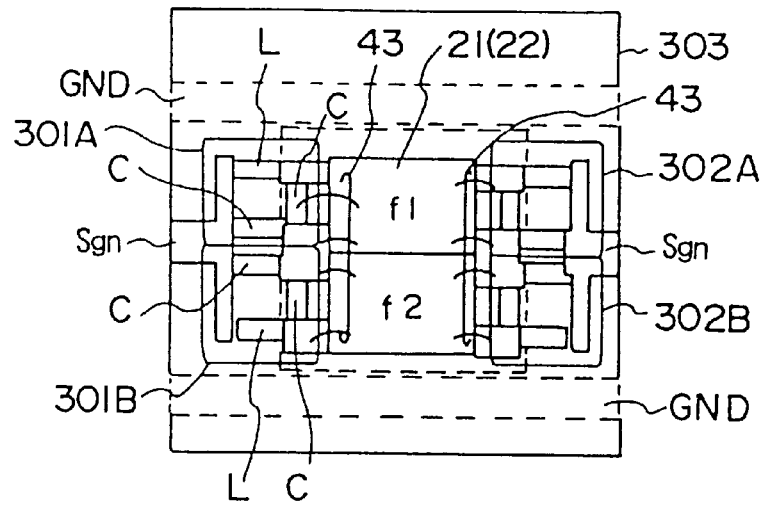
FIGS. 27A, 27B and 27C are diagrams showing the construction of the elements of the filter device in FIG. 26.
Figure 27B:
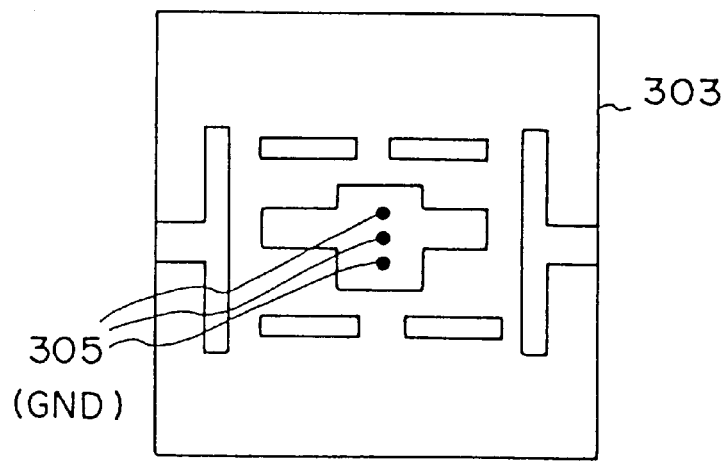
Figure 27C:
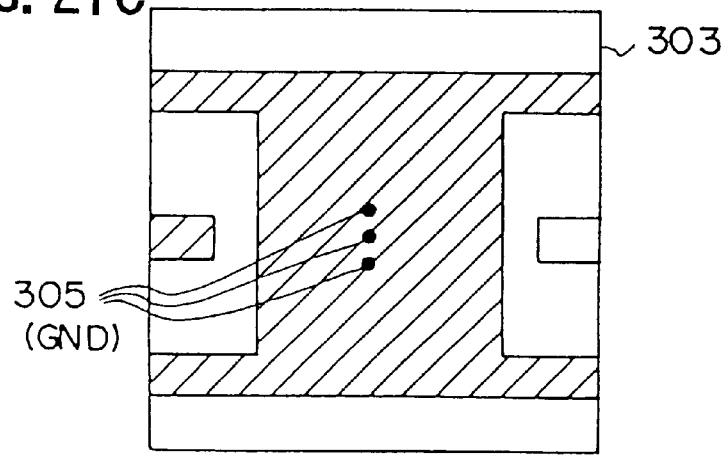
Figure 28A:
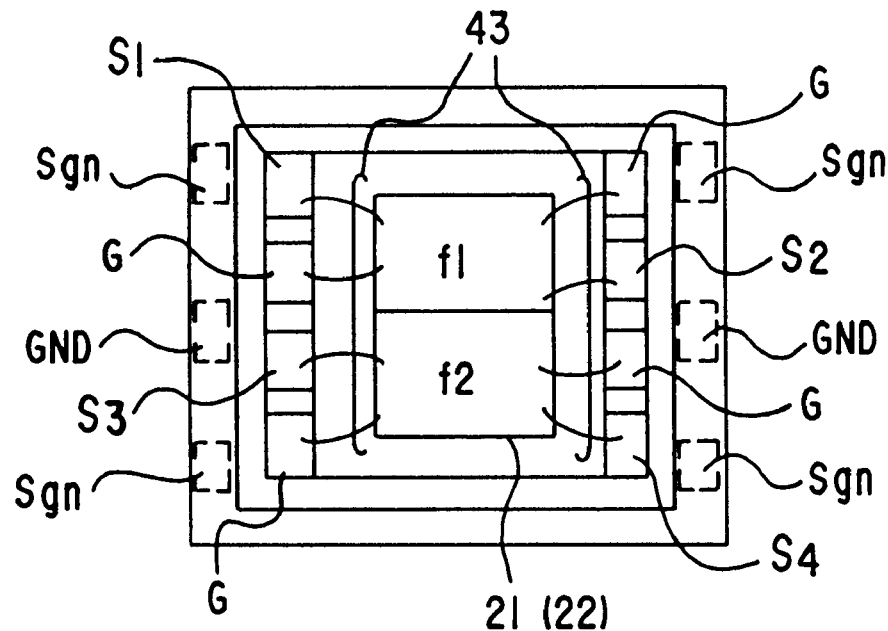
FIGS. 28A and 28B are top and cross-sectional views of the elements of the filter device in FIG. 26.
Figure 28B:
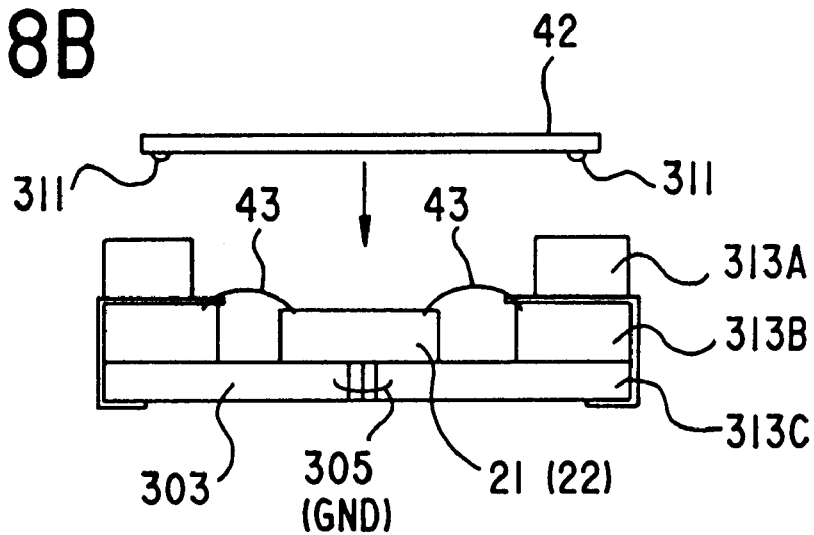

FIG. 26 shows a filter device in a sixth embodiment of the present invention. FIGS. 27A, 27B and 27C show the elements of the filter device in FIG. 26. FIGS. 28A and 28B show the construction of the elements of the filter device in FIG. 26. FIGS. 29A through 29D show the multi-layer, leadless-chip-carrier structure of the filter device in FIG. 26.

In FIGS. 26 through 29D, the elements which are the same as corresponding elements of the previous embodiment are designated by the same reference numerals, and a description thereof will be omitted.

As shown in FIG. 26, the filter device of the present embodiment includes the elements which are essentially the same as the elements of the previous embodiment. The filter device has a leadless-chip-carrier structure, and comprises the filter elements 21 and 22, the input phase matching units 301A and 301B, and the output phase matching units 302A and 302B.

As shown in FIGS. 27A through 28B, the filter device of the present embodiment has the multi-layer structure which includes a first layer 313A, a second layer 313B, and a third layer 313C. The filter elements 21 and 22 are packaged on the ceramic substrate 303 (the third layer 313C), and the input phase matching units 301A and 301B and the output phase matching units 302A and 302B are packaged on the ceramic substrate 303 (the third layer 313C).

Similarly to the previous embodiment, each of the input phase matching units 301A and 301B and the output phase matching units 302A and 302B in the present embodiment can be arranged by using a single inductor L and two capacitors C in the π-shaped formation as shown in FIG. 16A. Alternatively, as shown in FIG. 16B, each of the input phase matching units 301A and 301B and the output phase matching units 302A and 302B in the present embodiment can be arranged in the L-shaped formation by using a single inductor L and a single capacitor C.

As shown in FIGS. 27A and 28A, in the present embodiment, the filter elements 21 and 22, the signal terminals "S1", "S2", "S3" and "S4", the grounding terminals "G", and the wiring electrically interconnecting these elements are packaged on the same surface of the ceramic substrate 303 which is included in the package 30.

As shown in FIG. 26, in the filter device of the present embodiment, the filter elements 21 and 22 respectively pass only signals within the predetermined frequency passbands having the different center frequencies f1 and f2. The input phase matching unit 301A is connected to the input (the connection terminal) of the filter element 21. The input phase matching unit 301B is connected to the input (the connection terminal) of the filter element 22. The output phase matching unit 302A is connected to the output (the connection terminal) of the filter element 21. The output phase matching unit 302B is connected to the output (the connection terminal) of the filter element 22. These elements are packaged on the same surface of the ceramic substrate 303.

As described above, the filter elements 21 and 22 may be arranged in parallel by using two filter elements having the center frequencies f1 and f2. Alternatively, the filter elements 21 and 22 may be arranged on a common piezoelectric crystal board which is similar to the piezoelectric crystal board 65 in FIG. 13.

The filter elements 21 and 22 in the present embodiment are provided by using the surface acoustic wave (SAW) filter elements which are similar to those described above in the first embodiment with reference to FIGS. 4A and 4B. The SAW filter elements in FIGS. 4A and 4B are the ladder-type SAW filter elements in which a plurality of SAW resonators are arrayed in the ladder-like formation.

The input phase matching units 301A and 301B and the output phase matching units 302A and 302B in the present embodiment may be arranged by using the inductors L and the capacitors C in one of the π-shaped formation in FIG. 16A and the L-shaped formation in FIG. 16B.

As shown in FIG. 27A, the inductors L and the capacitors C of the input phase matching units 301A and 301B and the output phase matching units 302A and 302B, the filter elements 21 and 22, the signal terminals "Sgn" (and the signal terminals S1, S2, S3 and S4 in FIG. 28A), the grounding terminals "GND" (and the grounding terminals G in FIG. 28A), and the wiring and electrode patterns electrically interconnecting these elements are packaged on the same surface of the ceramic substrate 303 which is included in the package 30.

As shown in FIGS. 28A and 28B, the signal terminals S1 and S2, the grounding terminals G, and the filter element 21 (f1) are electrically connected by the bonding wires 43 of the aluminum material via the connection terminals of the filter element 21. Similarly, the signal terminals S3 and S4, the grounding terminals G, and the filter element 22 (f2) are electrically connected by the bonding wires 43 via the connection terminals of the filter element 22. The wire bonding process is performed to achieve the electrical connections between these elements.

As described above, the filter device of the present embodiment has a leadless-chip-carrier structure, and the signal terminals "Sgn" and the grounding terminals "GND", which are shown in FIG. 28A, are provided on the top and bottom surfaces of the ceramic substrate 303 via the side surfaces thereof as shown in FIG. 28B.

FIG. 27B shows the electrode pattern on the top surface of the ceramic substrate 303, and FIG. 27C shows the electrode pattern on the bottom surface of the ceramic substrate 303.

The filter device of the present embodiment includes the conductive holes 305 which electrically interconnect the electrode pattern (GND) on the bottom surface of the ceramic substrate 303 and the electrode pattern (GND) on the top surface of the ceramic substrate 303. Thus, by using the conductive holes 305, the electrode pattern on the top surface of the ceramic substrate 303 and the electrode pattern on the bottom surface thereof are electrically connected to each other.

Further, as shown in FIG. 28B, the filter device of the present embodiment includes the cap 42. Using a sealer 311 primarily containing gold and tin, the cap 42 is attached to the cap adhesion portion 316 (shown in FIG. 29A) of the first layer 313A so that good adhesion between the ceramic substrate 303 and the cap 42 is achieved.

In the filter device of the present embodiment, the first layer 313A, the second layer 313B, and the third layer 313C are laminated together, so that the filter device having the multi-layer, leadless-chip-carrier structure is constructed.

Figure 29A:
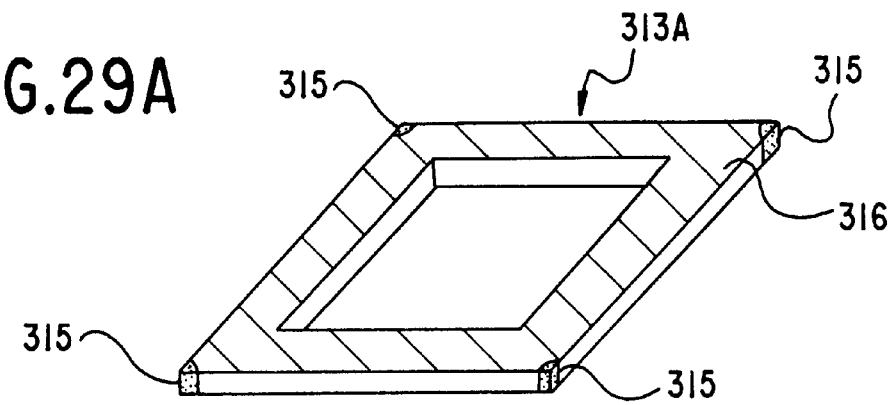
FIGS. 29A through 29D are diagrams showing the construction of the filter device in FIG. 26.

FIG. 29A shows the first layer 313A. As shown, electrodes 315 at the corners of the first layer 313A and the cap adhesion portion 316 on the top surface of the first layer 313A are formed on the first layer 313A. The electrodes 315 have a predetermined thickness on the side surfaces of the corners of the first layer 313A. The first layer 313A is made of the ceramic material that is the same as the material of the ceramic substrate 303.

Figure 29B:
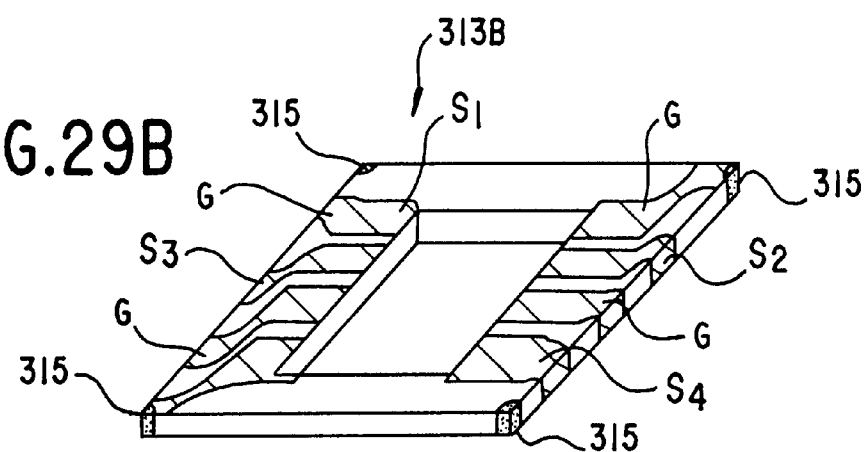

FIG. 29B shows the second layer 313B. As shown, the signal terminals S1, S2, S3 and S4 and the grounding terminals G are formed on the top surface of the second layer 313B. The second layer 313B is made of the ceramic material that is the same as the material of the first layer 313A. As shown in FIGS. 28A and 28B, the signal terminals S1 and S2 and the grounding terminals G are electrically connected to the connection terminals of the filter element 21 by the bonding wires 43 of the aluminum material, and the signal terminals S3 and S4 and the grounding terminals G are electrically connected to the connection terminals of the filter element 22 by the bonding wires 43. The wire bonding process is performed to form the above bonding wires 43.

Figure 29C:
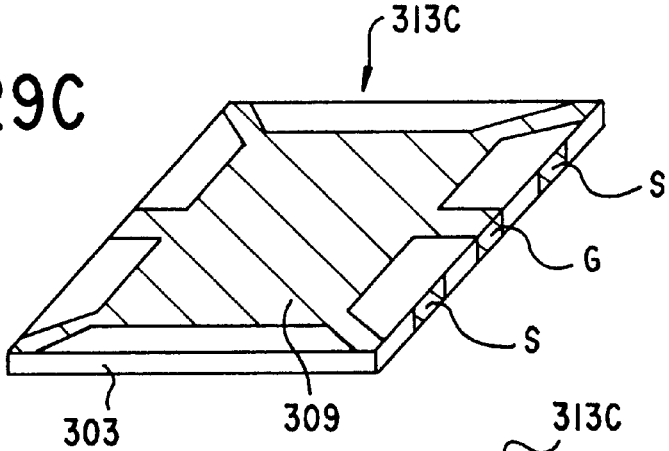

FIG. 29C shows the top surface of the third layer 313C. The third layer 313C of the present embodiment is the ceramic substrate 303 described above. As shown, a chip mounting portion 309, the signal terminals "S", and the grounding terminals G are formed on the top and side surfaces of the third layer 313C. The filter elements 21 and 22 are arranged on the chip mounting portion 309. The leadless-chip-carrier structure of the filter device is formed by using the signal terminals S and the grounding terminals G on the third layer 313C.

Figure 29D:
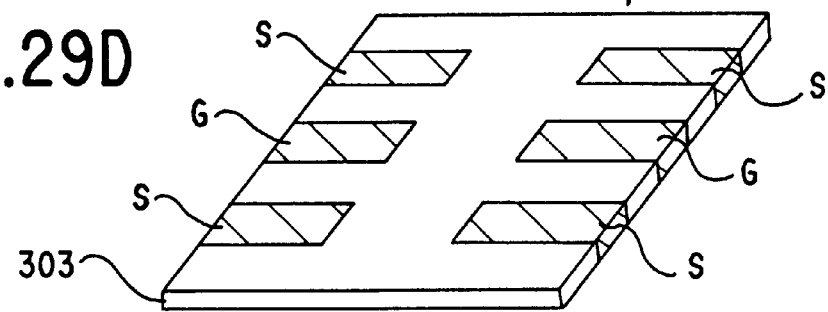

FIG. 29D shows the bottom surface of the third layer 313C. As shown, the signal terminals S and the grounding terminals G are formed on the bottom and side surfaces of the third layer 313C. The leadless-chip-carrier structure of the filter device is formed by using the signal terminals S and the grounding terminals G on the third layer 313C.

The filter device of the present embodiment has a single package in which at least two filter elements, each passing only signals within a predetermined frequency band, the frequency bands of the filter elements having center frequencies which are distinct from each other, are provided. It is possible for the present invention to provide a filter device which provides good performance of band-pass filtering and allows the construction of a small-size, light-weight radio signal portion of a dual-band radio system with a high reliability. Further, the filter device of the present embodiment has a leadless-chip-carrier structure, and it is possible to provide a dual-band radio system having a small-size, light-weight radio signal portion with a high reliability.

Figure 30:
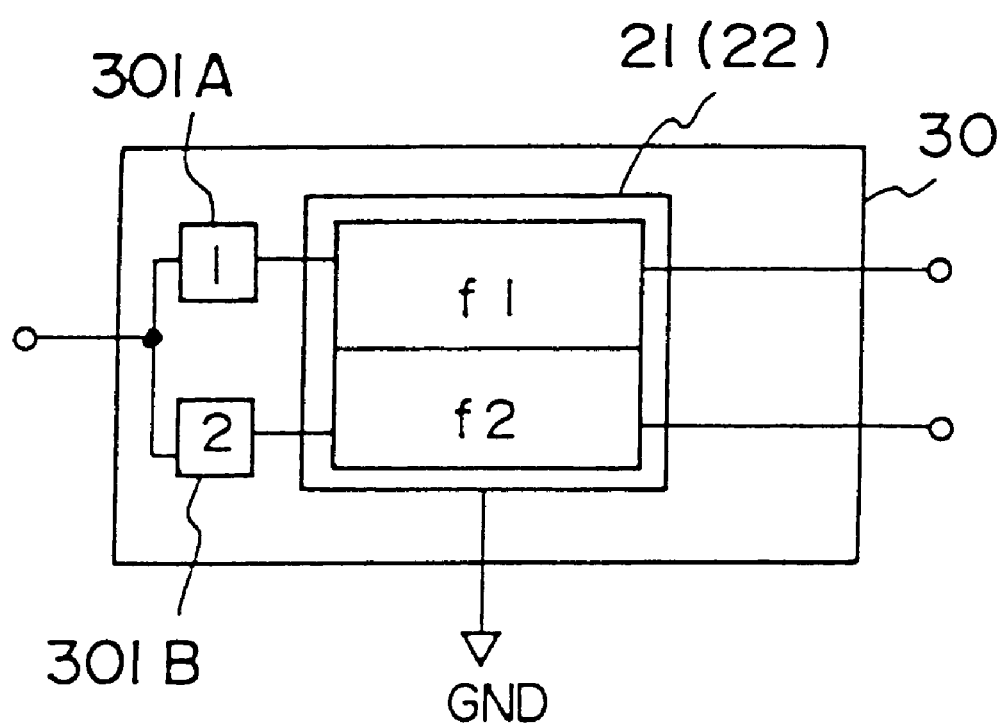
FIG. 30 is a block diagram of a filter device in a seventh embodiment of the present invention.
Figure 31A:
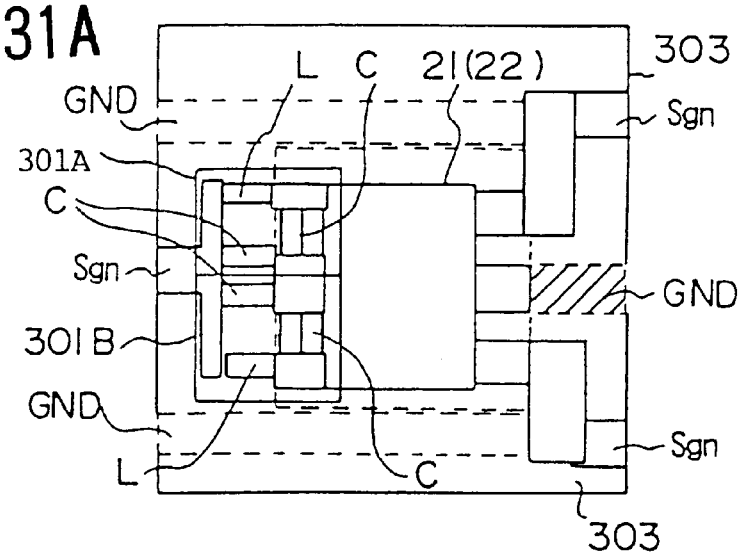
FIGS. 31A, 31B and 31C are diagrams showing the construction of the elements of the filter device in FIG. 30.
Figure 31B:
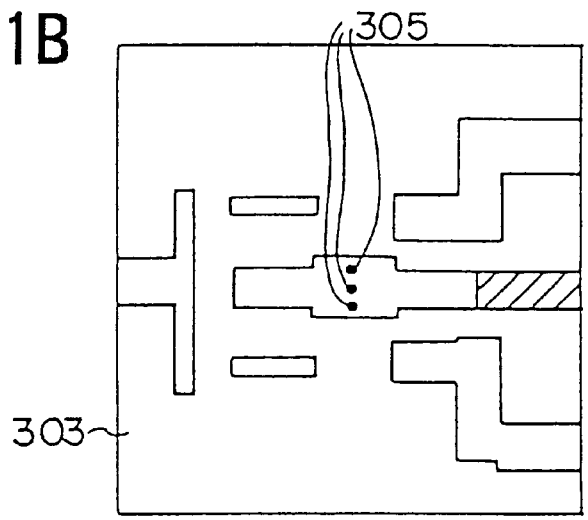
Figure 31C:
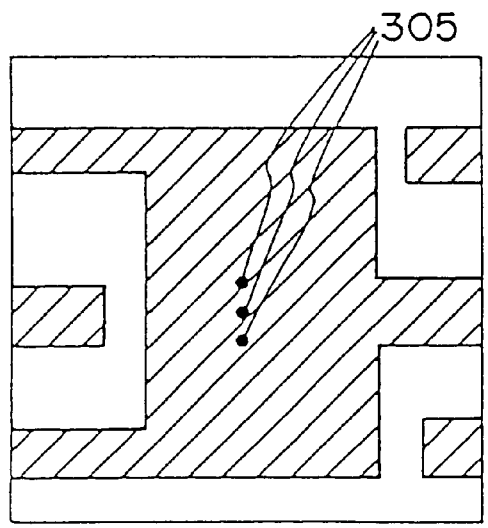
Figure 32A:
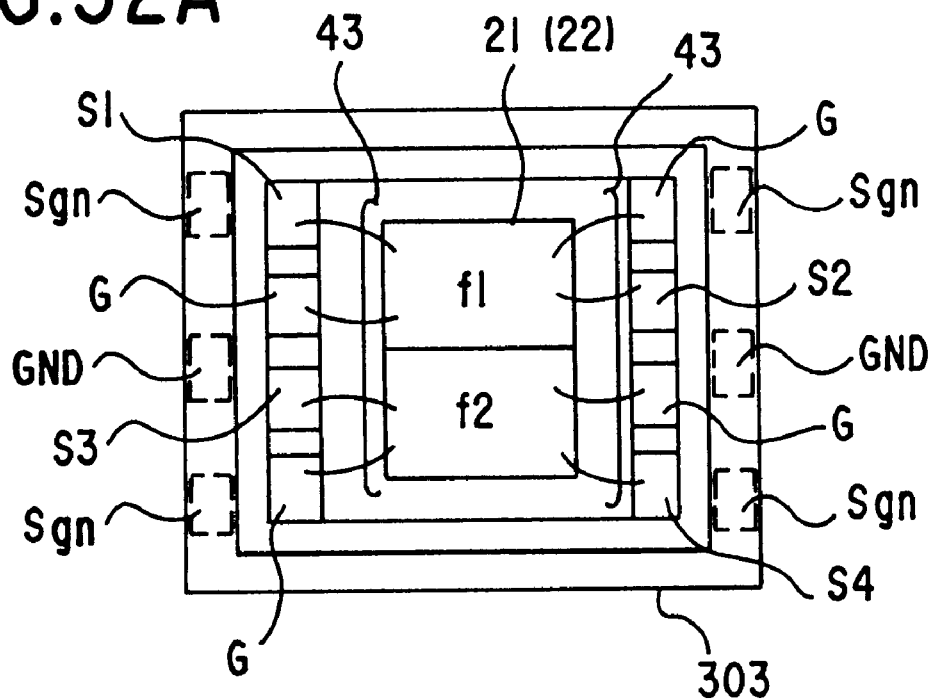
FIGS. 32A and 32B are top and cross-sectional views of the elements of the filter device in FIG. 30.
Figure 32B:
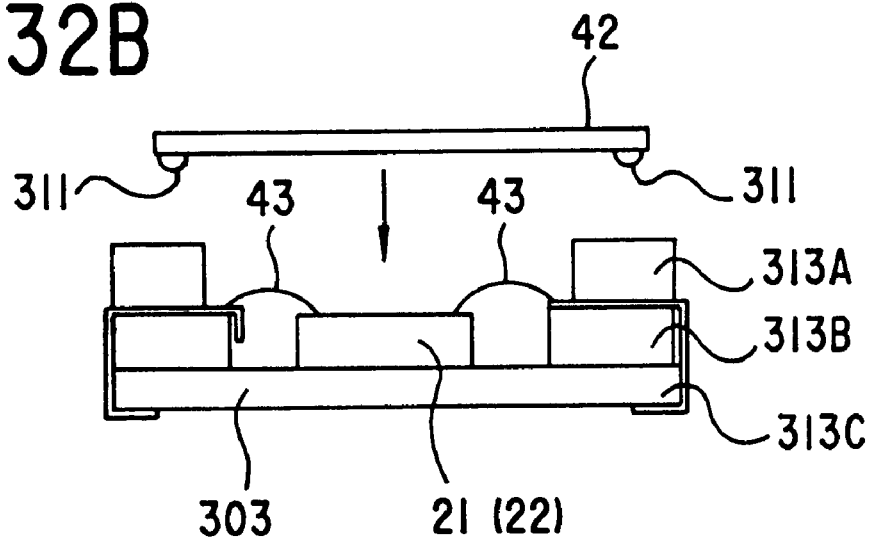

FIG. 30 shows a filter device in a seventh embodiment of the present invention. FIGS. 31A, 31B and 31C show the elements of the filter device in FIG. 30. FIGS. 32A and 32B show the construction of the elements of the filter device in FIG. 30.

In FIGS. 30 through 32B, the elements which are the same as corresponding elements of the previous embodiment are designated by the same reference numerals, and a description thereof will be omitted.

As shown in FIG. 30, the filter device of the present embodiment includes the filter elements 21 and 22, the input phase matching units 301A and 301B, and the package 30. The filter elements 21 and 22 and the input phase matching units 301A and 301B are packaged on a single surface of the package 30.

In the filter device of the present embodiment, the filter elements 21 and 22 respectively pass only signals within predetermined frequency bands having center frequencies f1 and f2 which are distinct from each other. The input phase matching unit 301A is connected to the input (the connection terminal) of the filter element 21. The input phase matching unit 301B is connected to the input (the connection terminal) of the filter element 22. The filter device of the present embodiment has two outputs connected to the outputs of the filter elements 21 and 22.

In the filter device of the present embodiment, the filter elements 21 and 22 may be arranged in parallel by using two filter elements having the center frequencies f1 and f2. Alternatively, the filter elements 21 and 22 may be arranged on a common piezoelectric crystal board which is similar to the piezoelectric crystal board 65 in FIG. 13.

More specifically, the filter elements 21 and 22 are provided by using the surface acoustic wave (SAW) filter elements which are similar to those shown in FIGS. 4A and 4B. The SAW filter elements in FIGS. 4A and 4B are the ladder-type SAW filter elements in which a plurality of SAW resonators are arrayed in the ladder-like formation.

As described above, the filter elements 21 and 22 have the connection terminals connected to the input phase matching units 301A and 301B. At least one of the input phase matching units 301A and 301B includes inductors and capacitors.

The input phase matching units 301A and 301B in the present embodiment may be arranged by using the inductors L and the capacitors C in one of the π-shaped formation in FIG. 16A and the L-shaped formation in FIG. 16B.

FIGS. 31A, 31B and 31C show the construction of the elements of the filter device of the present embodiment. The inductors "L" and capacitors "C" of the input phase matching units 301A and 301B, the filter elements 21 and 22, the signal terminals "Sgn" (and the signal terminals "S1", "S2", "S3" and "S4" in FIG. 32A) and the grounding terminals "GND" (and the grounding terminals "G" in FIG. 32A), and the wiring and electrode pattern electrically interconnecting these elements are packaged on the same surface of the ceramic substrate 303 which is included in the package 30.

As shown in FIGS. 32A and 32B, the input phase matching units 301A and 301B and the filter elements 21 and 22 are electrically connected by the bonding wires 43 of the aluminum material via the connection terminals. The wire bonding process is performed to achieve the electrical connections between the input phase matching units 301A and 301B and the filter elements 21 and 22.

As shown in FIGS. 32A and 32B, the filter device of the present embodiment has the multi-layer, leadless-chip-carrier structure which is the same as that of the filter device of the sixth embodiment. The multi-layer, leadless-chip-carrier structure includes the first layer 313A, the second layer 313B, and the third layer 313C. The filter elements 21 and 22 and the input phase matching units 301A and 301B are packaged on the top surface of the ceramic substrate 303 (the third layer 313C).

As shown in FIG. 32A, the signal terminals S1 and S2, the grounding terminals G, and the filter element 21 (f1) are electrically connected by the bonding wires 43 of the aluminum material via the connection terminals of the filter element 21. Similarly, the signal terminals S3 and S4, the grounding terminals G, and the filter element 22 (f2) are electrically connected by the bonding wires 43 via the connection terminals of the filter element 22. The wire bonding process is performed to achieve the electrical connections between these elements.

As described above, the filter device of the present embodiment has the leadless-chip-carrier structure, and the signal terminals "Sgn" and the grounding terminals "GND" are provided on the ceramic substrate 303 via the side surfaces of the ceramic substrate 303 as shown in FIG. 32B.

As shown in FIG. 31A, the inductors L and the capacitors C of the input phase matching units 301A and 301B in the present embodiment, and the wiring and electrode patterns electrically interconnecting these elements are packaged on the ceramic substrate 303.

FIG. 31B shows the electrode pattern on the top surface of the ceramic substrate 303, and FIG. 31C shows the electrode pattern on the bottom surface of the ceramic substrate 303. Further, the filter device of the present embodiment has the conductive holes 305 which electrically interconnect the electrode pattern on the bottom surface of the ceramic substrate 303 and the electrode pattern on the top surface of the ceramic substrate 303.

Similarly, the filter elements 21 and 22 on the top surface of the ceramic substrate 303 and the electrode pattern on the bottom surface of the ceramic substrate 303 are electrically interconnected by the conductive holes 305.

Further, as shown in FIG. 32B, the filter device of the present embodiment includes the cap 42. The cap 42 is attached to the cap adhesion portion 316 (as shown in FIG. 29A) of the first layer 313A so that good adhesion between the ceramic substrate 303 and the cap 42 is achieved.

As described above with respect to various embodiments of the present invention, the filter device of the present invention has a single package which incorporates at least two filter elements, each passing only signals within a predetermined frequency band, the filter elements having center frequencies of the frequency bands which are distinct from each other. It is possible for the present invention to provide a filter device which provides good performance of band-pass filtering and allows the construction of a small-size, light-weight radio signal portion of a dual-band radio system. Further, the filter device of the present invention has a leadless-chip-carrier structure, and it is possible to provide a dual-band radio system having a small-size, light-weight radio signal portion with a high reliability.

What is claimed is:

1. A filter device comprising:
    a package;
    at least two filter elements, provided in said package, each of said at least two filter elements passing only signals within a predetermined radio frequency band used by a radio signal portion of a dual-band radio system, said predetermined radio frequency bands of said at least two filter elements having center frequencies which are distinct from each other;
    an input terminal connected to and shared by respective inputs of said at least two filter elements;
    an output terminal connected to and shared by respective outputs of said at least two filter elements;
    a first phase matching unit provided between the input terminal and the inputs of said at least two filter elements, wherein said first phase matching unit comprises a first transmission line connected to the input terminal and connected to one of said at least two filter elements, a first inductor, and a first capacitor, said first inductor and said first capacitor being connected to the input terminal and connected to another one of said at least two filter elements; and
    a second phase matching unit provided between the output terminal and the outputs of said at least two filter elements, wherein said second phase matching unit comprises a second transmission line connected to the output terminal and connected to said one of said at least two filter elements, a second inductor, and a second capacitor, said second inductor and said second capacitor being connected to the output terminal and connected to said another one of said at least two filter elements,
    wherein said at least two filter elements include surface acoustic wave filter elements each of which passes only the signals within the predetermined radio frequency band;
    wherein said first and second phase matching units rotate a phase of the frequency passband for impedance matching with respect to said at least two filter elements;
    wherein said at least two filter elements, said first phase matching unit, and said second phase matching unit are packaged on a surface of said package;
    wherein said package comprises a cap which hermetically seals said at least two filter elements in said package;
    wherein said package has a leadless-chip-carrier structure, said at least two filter elements being packaged on a first surface of said package, and at least one of the first phase matching unit and the second phase matching unit being packaged on a second, opposite surface of said package;
    wherein said first phase matching unit comprises a first transmission line connected to the input terminal and connected to one of said at least two filter elements, and said second phase matching unit comprises a second transmission line connected to the output terminal and connected to said one of said at least two filter elements; and
    wherein said at least two filter elements and said at least one of the first phase matching unit and the second phase matching unit are eclectically connected to each other via said first and said second transmission lines.

2. The filter device according to claim 1, wherein said at least two filter elements comprise surface acoustic wave filter elements, each surface acoustic wave filter element including a number of surface acoustic wave resonators arrayed in a ladder formation, said surface acoustic wave filter elements including:
    a first surface acoustic wave filter element, which constitutes one of said at least two filter elements, having parallel resonators disposed at inputs of said first surface acoustic wave filter element and at outputs of said first surface acoustic wave filter element; and
    a second surface acoustic wave filter element, which constitutes another one of said at least two filter elements, having series resonators disposed at an input of said second surface acoustic wave filter element and at an output of said second surface acoustic wave filter element.

3. The filter device according to claim 2, wherein said first surface acoustic wave filter element has a center frequency lower than a center frequency of said second surface acoustic wave filter element.

4. The filter device according to claim 1, wherein said package comprises:
    a laminated member having conductive layers and insulating layers alternately laminated, said laminated member including recessed portions; and
    a cap which seals said at least two filter elements in the recessed portions of said laminated member.

5. The filter device according to claim 1, wherein said package comprises a laminated member, said laminated member having conductive layers and insulating layers alternately laminated, and said first and said second transmission lines being constituted by one of the conductive layers of said laminated member.

6. The filter device according to claim 1, wherein said first and said second transmission lines are positioned on an external surface of said package.

7. The filter device according to claim 1, wherein said first and said second transmission lines are positioned on an external surface of said package, and said at least two filter elements are positioned on said external surface of said package.

8. The filter device according to claim 1, further comprising:
    a connection terminal connected to said at least one of the first phase matching unit and the second phase matching unit,
    at least one of the first phase matching unit and the second phase matching unit comprising an inductor and a capacitor.

9. The filter device according to claim 8, wherein said connection terminal externally connects said at least one of the first phase matching unit and the second phase matching unit to said filter device.

10. The filter device according to claim 1, wherein
    said at least two filter elements, said first phase matching unit, and said second phase matching unit are packaged on a surface of said package.

11. A radio system comprising:

a radio signal transmitter unit processing modulated signals at an input of the radio signal transmitter unit to generate a transmitting radio signal at an output, said transmitting radio signal being transmitted to an external station;

a radio signal receiver unit processing a signal at an input of the radio signal receiver unit to generate a receiving radio signal at an output;

a modulator unit generating the modulated signals at outputs of the modulator unit from processed signals at inputs of the modulator unit through a modulation;

a demodulator unit generating demodulated signals at outputs of the demodulator unit from the receiving radio signal from the radio signal receiver unit at an input of the demodulator unit through a demodulation;

a base-band signal processor unit generating the processed signals at outputs of the base-band signal processor unit from an audio signal at an input of the base-band signal processor unit through a base-band signal processing, said outputs of said base-band signal processor unit being connected to the inputs of the modulator unit, said signal processor unit having another output at which an audio signal is generated from the demodulated signals at other inputs of the base-band signal processor unit through a base-band signal processing, said other inputs of said base-band signal processor unit being connected to the outputs of the demodulator unit, each of said transmitter unit and said receiver unit comprising at least one filter device, said at least one filter device comprising:

a package;

at least two filter elements, provided in said package, each of said at least two filter elements passing only signals within a predetermined radio frequency band used by a radio signal portion of a dual-band radio system, said predetermined radio frequency bands of said at least two filter elements having center frequencies which are distinct from each other;

an input terminal connected to and shared by respective inputs of said at last two filter elements; and an output terminal connected to and shared by respective outputs of said at least two filter elements;

a first phase matching unit provided between the input terminal and the inputs of said at least two filter elements, wherein said first phase matching unit comprises a first transmission line connected to the input terminal and connected to one of said at least two filter elements, a first inductor, and a first capacitor, said first inductor and said first capacitor being connected to the input terminal and connected to another one of said at least two filter elements; and a second phase matching unit provided between the output terminal and the outputs of said at least two filter elements, wherein said second phase matching unit comprises a second transmission line connected to the output terminal and connected to said one of said at least two filter elements, a second inductor, and a second capacitor, said second inductor and said second capacitor being connected to the output terminal and connected to said another one of said at least two filter elements, wherein said at least two filter elements include surface acoustic wave filter elements each of which passes only the signals within the predetermined radio frequency band;

wherein said first and second phase matching units rotate a phase of the frequency passband for impedance matching with respect to said at least two filter elements;

wherein said at least two filter elements, said first phase matching unit, and said second phase matching unit are packaged on a surface of said package;

wherein said package comprises a cap which hermetically seals said at least two filter elements in said package;

wherein said package has a leadless-chip-carrier structure, said at least two filter elements being packaged on a first surface of said package, and at least one of the first phase matching unit and the second phase matching unit being packaged on a second, opposite surface of said package;

wherein said first phase matching unit comprises a first transmission line connected to the input terminal and connected to one of said at least two filter elements, and said second phase matching unit comprises a second transmission line connected to the output terminal and connected to said one of said at least two filter elements; and wherein said at least two filter elements and said at least one of the first phase matching unit and the second phase matching unit are eclectically connected to each other via said first and said second transmission lines.

* * * * *